United States Patent
Ryu et al.

(10) Patent No.: US 11,690,263 B2
(45) Date of Patent: Jun. 27, 2023

(54) DISPLAY DEVICE AND PORTABLE TERMINAL

(71) Applicant: Samsung Display Co., LTD., Yongin-si (KR)

(72) Inventors: Ji Hun Ryu, Yongin-si (KR); Il Nam Kim, Yongin-si (KR); Won Sang Park, Yongin-si (KR); Eun Jin Sung, Yongin-si (KR); Seong Ryong Lee, Yongin-si (KR); Jong Hyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 17/028,915

(22) Filed: Sep. 22, 2020

(65) Prior Publication Data
US 2021/0225989 A1 Jul. 22, 2021

(30) Foreign Application Priority Data
Jan. 17, 2020 (KR) .................. 10-2020-0006434

(51) Int. Cl.
*H10K 59/131* (2023.01)
*H04M 1/02* (2006.01)
(Continued)

(52) U.S. Cl.
CPC ........ *H10K 59/131* (2023.02); *H04M 1/0266* (2013.01); *H04M 1/0268* (2013.01); *H10K 50/865* (2023.02); *H10K 59/60* (2023.02)

(58) Field of Classification Search
CPC ............ H01L 51/5284; H01L 27/3276; H01L 27/3227; H01L 27/3234; H04M 1/0266;
(Continued)

(56) References Cited

U.S. PATENT DOCUMENTS 10,482,304 B2 11/2019 Zhang
2016/0224819 A1* 8/2016 Kim .................. G06V 40/1318
(Continued)

FOREIGN PATENT DOCUMENTS

KR 10-2019-0008066 1/2019
KR 10-2019-0048282 5/2019
KR 10-2019-0053732 5/2019

*Primary Examiner* — Vongsavanh Sengdara
(74) *Attorney, Agent, or Firm* — H.C. Park & Associates, PLC

(57) ABSTRACT

A display device including a substrate; a display element layer on the substrate, the display element layer including light emitting devices; a circuit element layer between the substrate and the display element layer, the circuit element layer including signal lines and light transmitting areas which are located between the signal lines in a plan view and allow light to be transmitted therethrough; a first light blocking layer between the substrate and the circuit element layer, the first light blocking layer including first openings; and a second light blocking layer on the first light blocking layer, the second light blocking layer including second openings. The second light blocking layer includes second sub-light blocking layers disposed to be spaced apart from each other, the second sub-light blocking layers each having the second openings. The first openings of the first light blocking layer overlaps with an area between the second sub-light blocking layers.

14 Claims, 21 Drawing Sheets

(51) Int. Cl.
*H10K 50/86* (2023.01)
*H10K 59/60* (2023.01)

(58) Field of Classification Search
CPC ... H04M 1/0268; H04M 1/026; Y02E 10/549; H10K 50/865; H10K 59/131; H10K 59/60
See application file for complete search history.

(56) References Cited

U.S. PATENT DOCUMENTS

| | | | |
|---|---|---|---|
| 2018/0040675 A1* | 2/2018 | Zeng | G06F 3/0421 |
| 2018/0069068 A1* | 3/2018 | Ka | G06V 40/1306 |
| 2018/0129852 A1* | 5/2018 | Zeng | H10K 59/65 |
| 2019/0019000 A1 | 1/2019 | Lee et al. | |
| 2022/0037406 A1* | 2/2022 | Kubota | H10K 59/60 |

\* cited by examiner

FIG. 2A
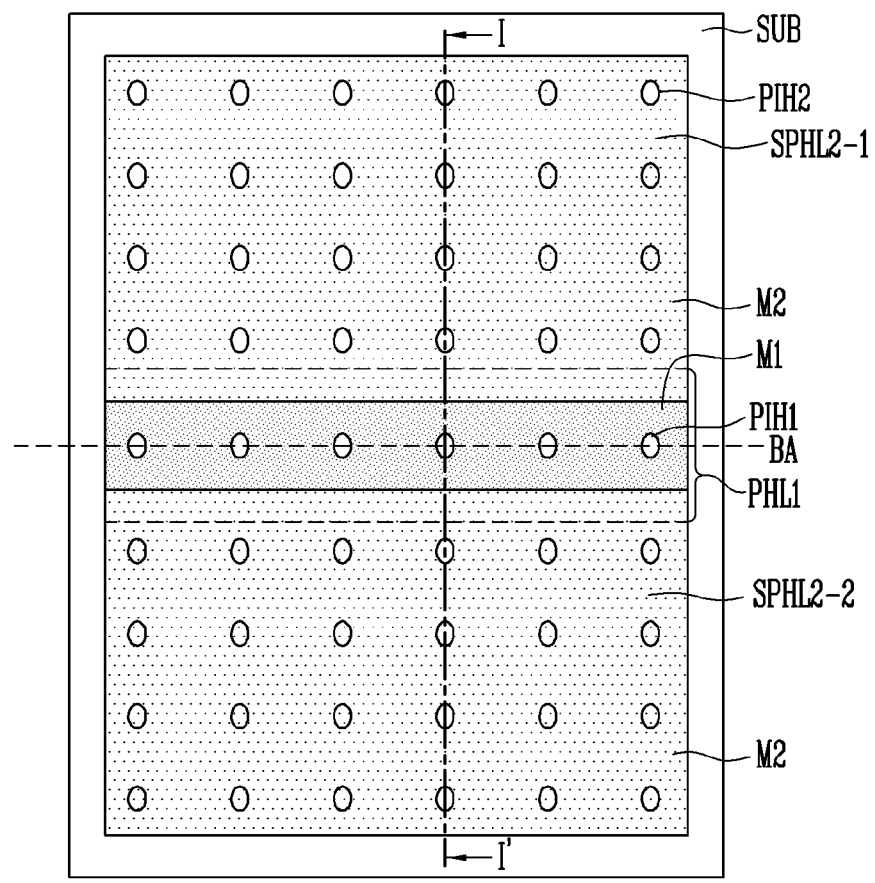
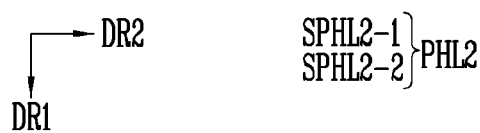

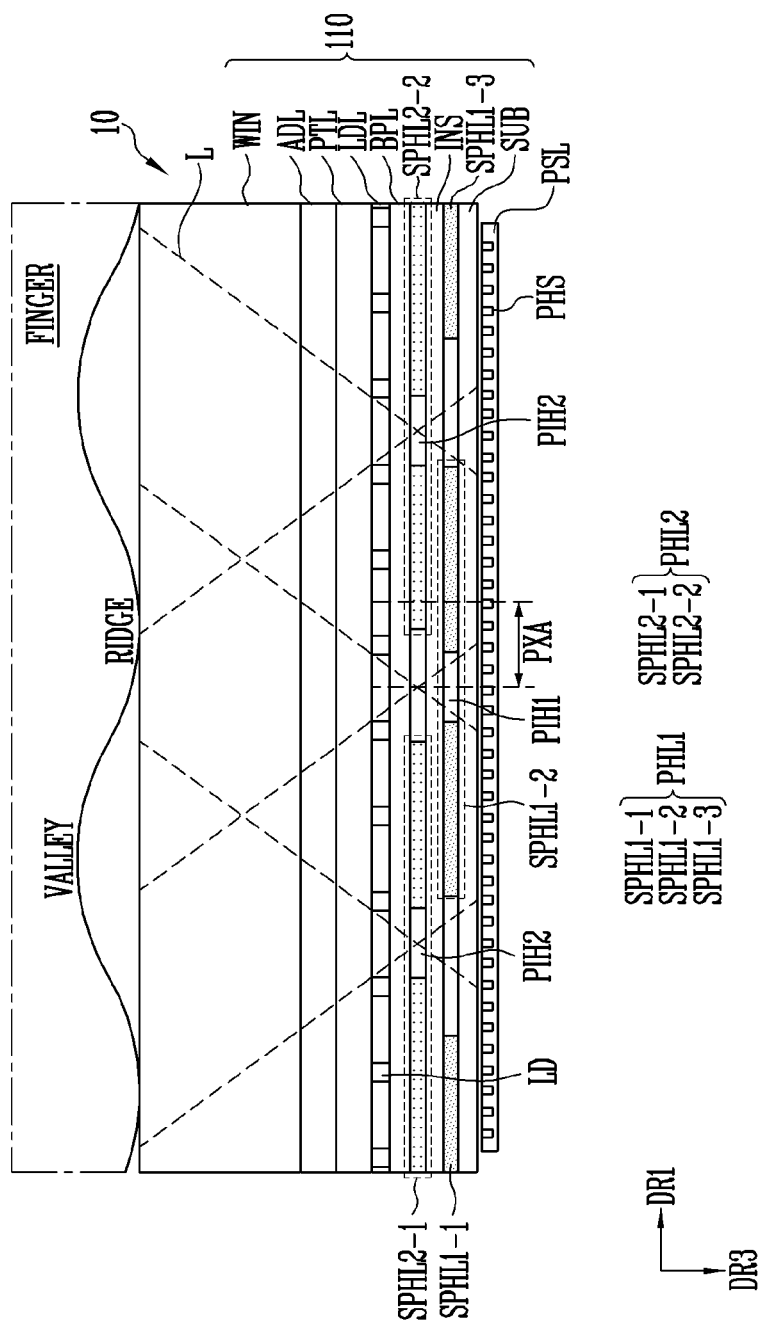

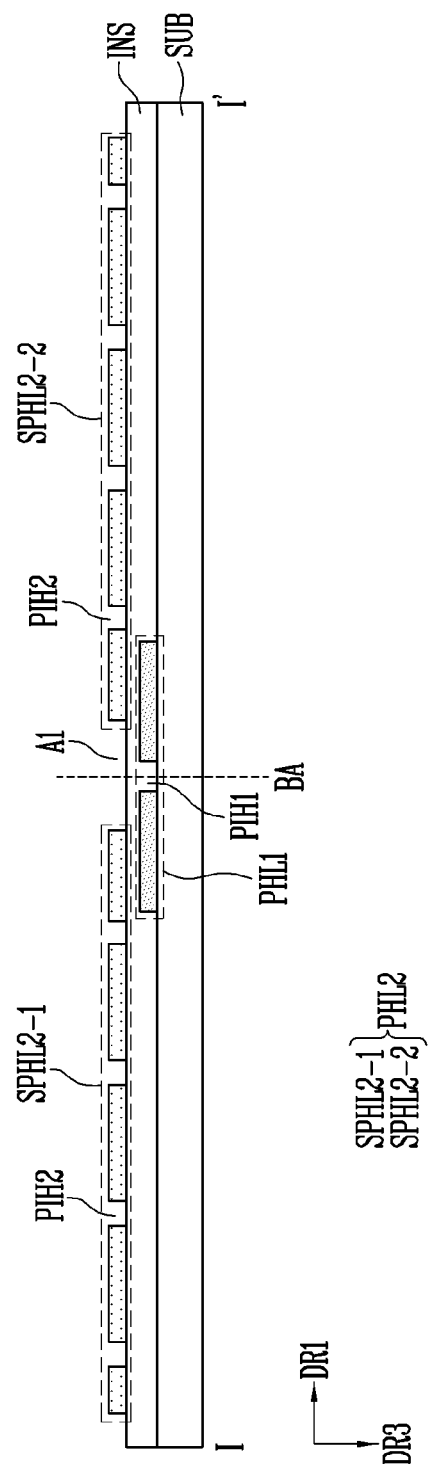

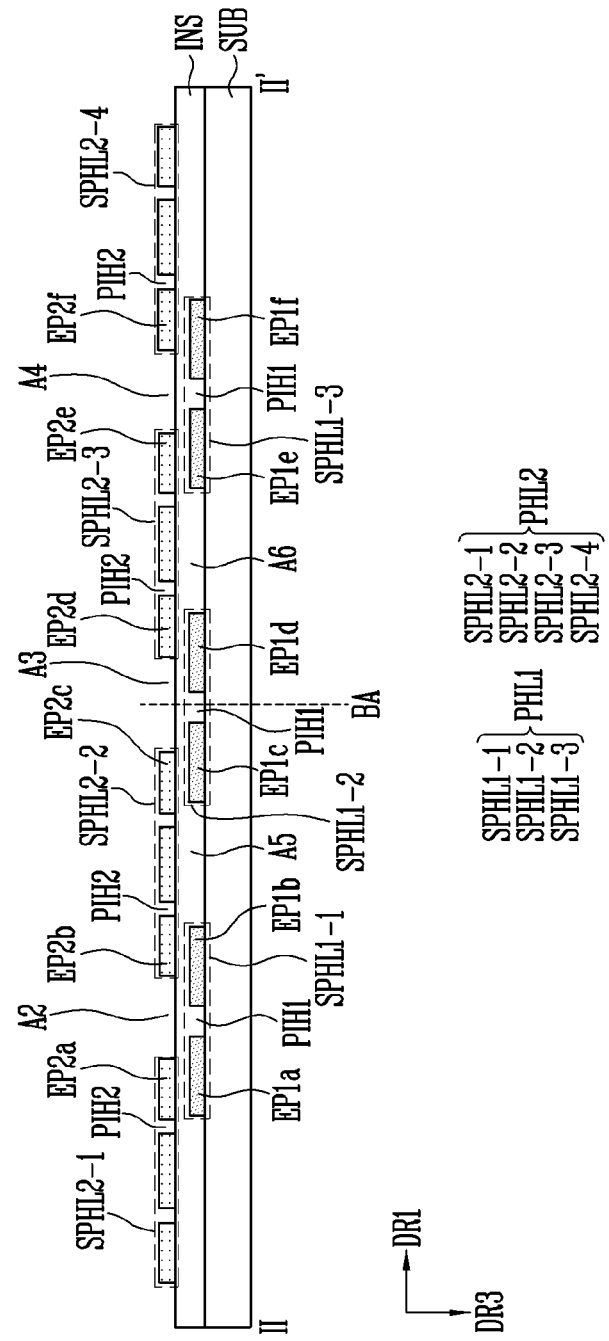

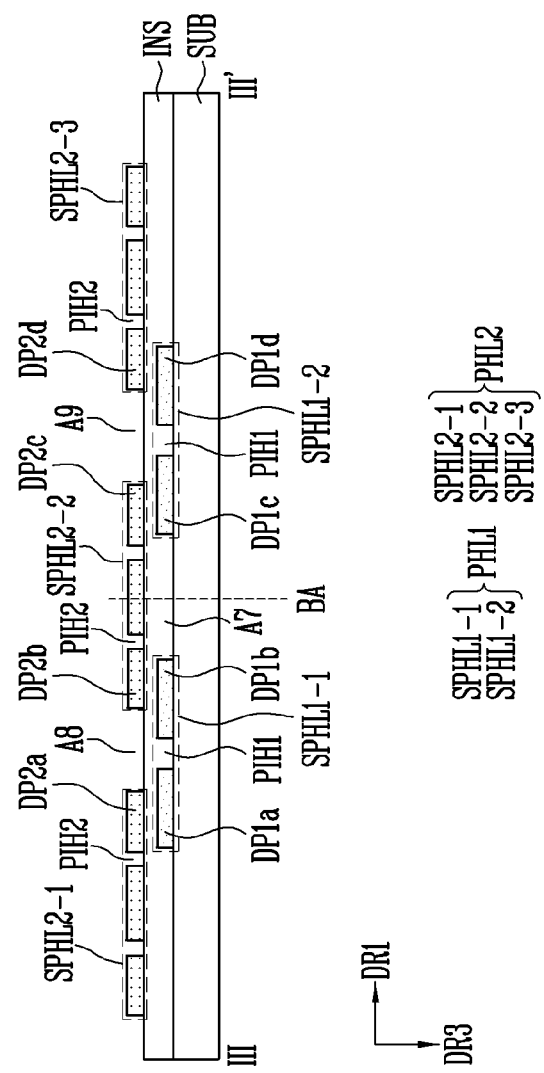

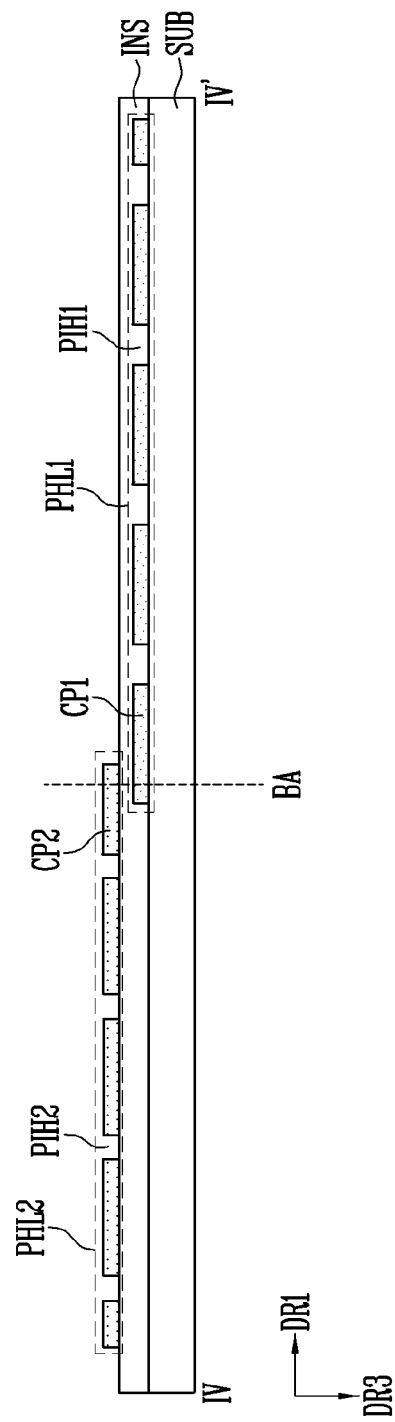

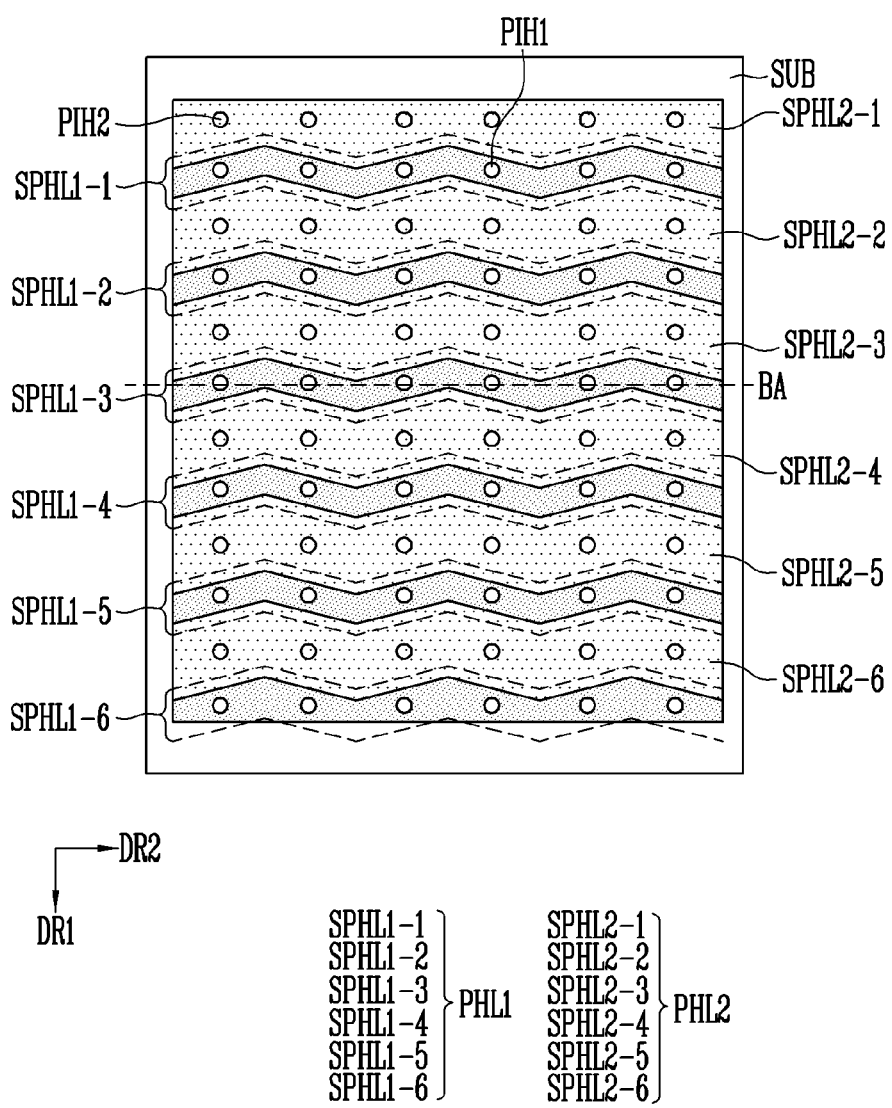

DISPLAY DEVICE AND PORTABLE TERMINAL

CROSS REFERENCE TO RELATED APPLICATION

This application claims priority from and the benefit of Korean Patent Application No. 10-2020-0006434, filed on Jan. 17, 2020, which is hereby incorporated by reference for all purposes as if fully set forth herein.

BACKGROUND

Field

Exemplary embodiments/implementations of the invention relate generally to a display device and a portable terminal.

Discussion of the Background

Recently, as display devices such as smartphones and tablet PCs are used in many fields, a biometric authentication method using a fingerprint, and the like has been widely used. In order to provide a fingerprint sensing function, a fingerprint sensor may be built in or attached to a display device.

The fingerprint sensor may be configured as, for example, a photosensitive type sensor. The photosensitive type fingerprint sensor may include a light source, a lens, and a photo sensor array.

The above information disclosed in this Background section is only for understanding of the background of the inventive concepts, and, therefore, it may contain information that does not constitute prior art.

SUMMARY

Exemplary embodiments of the invention provide a display device and a portable terminal, which include a light blocking layer capable of minimizing or reducing bending stress.

Additional features of the invention will be set forth in the description which follows, and in part will be apparent from the description, or may be learned by practice of the inventive concepts.

An exemplary embodiment of the invention provides a display device including a substrate; a display element layer provided on the substrate, the display element layer including a plurality of light emitting devices; a circuit element layer provided between the substrate and the display element layer, the circuit element layer including a plurality of signal lines through which a signal configured to drive the light emitting devices is transferred and a plurality of light transmitting areas which are located between the signal lines on a plane and allow light to be transmitted therethrough; a first light blocking layer provided between the substrate and the circuit element layer, the first light blocking layer including a plurality of first openings; and a second light blocking layer provided on the first light blocking layer, the second light blocking layer including a plurality of second openings, wherein the second light blocking layer includes second sub-light blocking layers disposed to be spaced apart from each other along a first direction, the second sub-light blocking layers each having the second openings, wherein the first openings of the first light blocking layer overlap with an area between the second sub-light blocking layers.

The first openings and the second openings may overlap with the light transmitting areas different from each other.

The substrate may be bendable with respect to a bending axis.

The second sub-light blocking layers adjacent to the bending axis may be spaced apart from each other with the bending axis interposed therebetween.

The first openings of the first light blocking layer may be disposed to overlap with the bending axis.

The first light blocking layer may first sub-light blocking layers disposed to be spaced apart from each other along the first direction, the first sub-light blocking layers each having the first openings.

At least a portion of one of the first sub-light blocking layers and at least a portion of one of the second sub-light blocking layers may overlap with each other.

The first openings of each of the first sub-light blocking layers may be provided not to overlap with the second sub-light blocking layers, and the second openings of each of the second sub-light blocking layers may be provided not to overlap with the first sub-light blocking layers.

The second light blocking layer may be electrically connected to at least one of the signal lines of the circuit element layer.

The first light blocking layer may be electrically connected to the second light blocking layer.

The display device may further include a sensor layer provided on the opposite surface of one surface of the substrate, on which the first light blocking layer is provided, the sensor layer sensing incident light.

Each of the first and second openings may provide an optical path of light incident into the sensor layer.

Another exemplary embodiment of the invention provides a display device including a substrate; a display element layer provided on the substrate, the display element layer including a plurality of light emitting devices; a circuit element layer provided between the substrate and the display element layer, the circuit element layer including a plurality of signal lines through which a signal configured to drive the light emitting devices is transferred and a plurality of light transmitting areas which are located between the signal lines on a plane and allow light to be transmitted therethrough; a first light blocking layer provided between the substrate and the circuit element layer, the first light blocking layer including a plurality of first openings; and a second light blocking layer provided on the first light blocking layer, the second light blocking layer including a plurality of second openings, wherein the first light blocking layer includes first sub-light blocking layers disposed to be spaced apart from each other along a first direction, the first sub-light blocking layers each having the first openings, wherein the second openings of the second light blocking layer overlap with an area between the first sub-light blocking layers.

The substrate may be bendable with respect to a bending axis. The first sub-light blocking layers adjacent to the bending axis may be spaced apart from each other with the bending axis interposed therebetween.

The second light blocking layer may include second sub-light blocking layers disposed to be spaced apart from each other along the first direction, the second sub-light blocking layers each having the second openings.

At least a portion of one of the first sub-light blocking layers and at least a portion of one of the second sub-light blocking layers may overlap with each other.

The first openings of each of the first sub-light blocking layers may be provided not to overlap with the second sub-light blocking layers, and the second openings of each of the second sub-light blocking layers may be provided not to overlap with the first sub-light blocking layers.

A portion of at least one of the first light blocking layer and the second light blocking layer may overlap with the bending axis.

The first sub-light blocking layers may extend in a zigzag form along a second direction different from the first direction. The second light blocking layer may include second sub-light blocking layers disposed to be spaced apart from each other along the first direction, the second sub-light blocking layers extending in a zigzag form along the second direction.

Another exemplary embodiment of the invention provides a portable terminal including a substrate; a display element layer provided on the substrate, the display element layer including a plurality of light emitting devices; a circuit element layer provided between the substrate and the display element layer, the circuit element layer including a plurality of signal lines through which a signal configured to drive the light emitting devices is transferred and a plurality of light transmitting areas which are located between the signal lines on a plane and allow light to be transmitted therethrough; a first light blocking layer provided between the substrate and the circuit element layer, the first light blocking layer including a plurality of first openings; and a second light blocking layer provided on the first light blocking layer, the second light blocking layer including a plurality of second openings, wherein the second light blocking layer includes second sub-light blocking layers disposed to be spaced apart from each other along a first direction, the second sub-light blocking layers each having the second openings, wherein the first openings of the first light blocking layer overlap with an area between the second sub-light blocking layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 2A and 2B are plan views illustrating first and second light blocking layers in accordance with various embodiments of the inventive concepts.

FIG. 4 is a sectional view schematically illustrating the display device in accordance with an embodiment of the inventive concepts.

FIG. 12 is a plan view illustrating first and second light blocking layers in accordance with still another embodiment of the inventive concepts.

DETAILED DESCRIPTION

Figure 1:
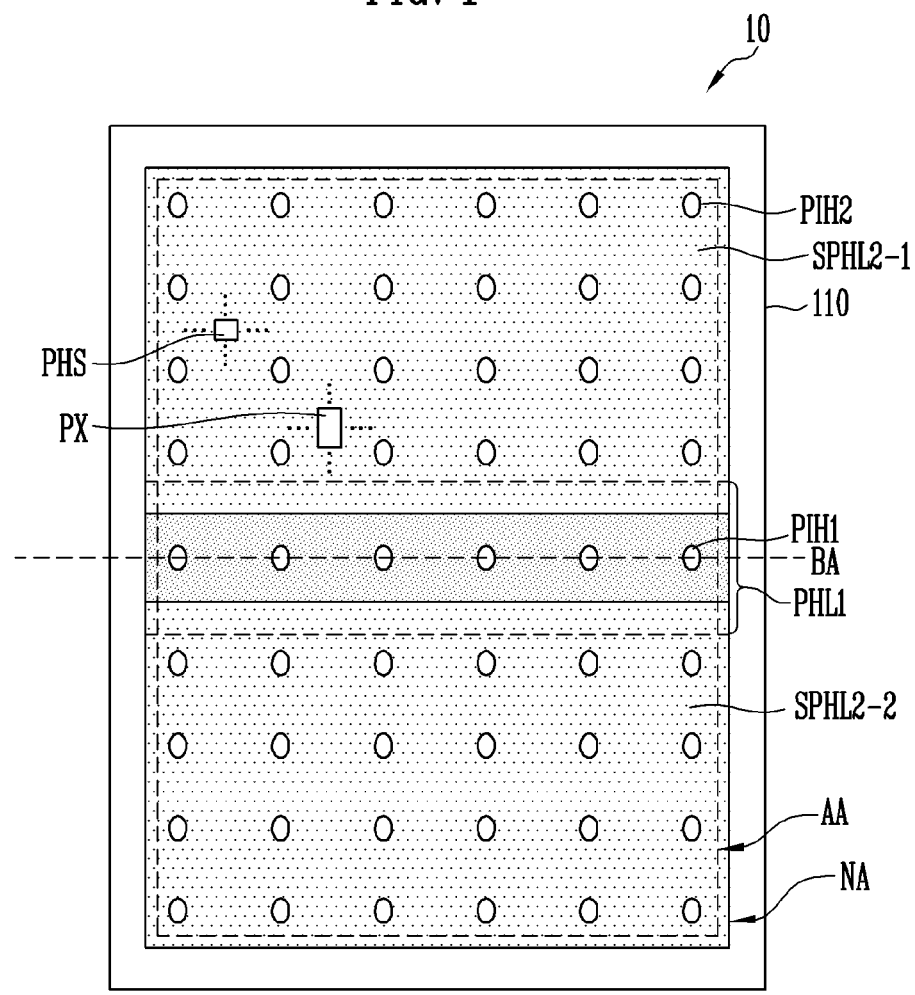
FIG. 1 is a plan view schematically illustrating a display device in accordance with an embodiment of the inventive concepts.

Hereinafter, exemplary embodiments of the inventive concepts will be described in more detail with reference to the accompanying drawings. Throughout the drawings, the same reference numerals are given to the same elements, and their overlapping descriptions will be omitted.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 2B:
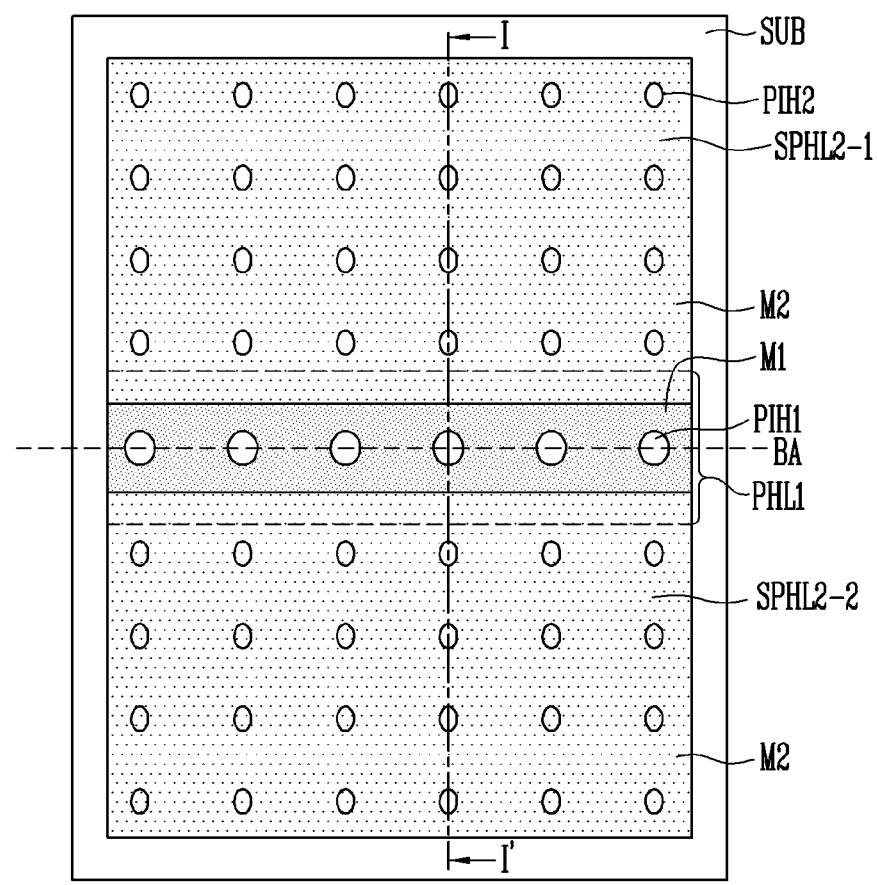
Figure 3:
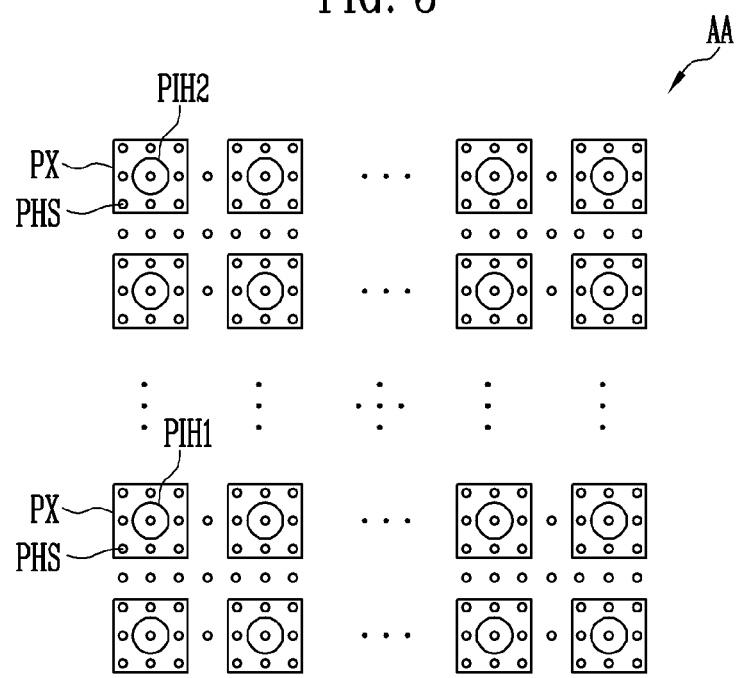
FIG. 3 is a plan view illustrating an arrangement structure of pixels, first and second openings, and photo sensors in accordance with an embodiment of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein. FIG. 1 is a plan view schematically illustrating a display device in accordance with an embodiment of the inventive concepts. FIGS. 2A and 2B are plan views illustrating first and second light blocking layers in accordance with various embodiments of the inventive concepts. FIG. 3 is a plan view illustrating an arrangement structure of pixels, first and second openings, and photo sensors in accordance with an embodiment of the inventive concepts. FIG. 4 is a sectional view schematically illustrating the display device in accordance with an embodiment of the inventive concepts.

Referring to FIGS. 1 to 4, the display device 10 in accordance with the embodiment of the inventive concepts may include a substrate SUB, first and second light blocking layers PHL1 and PHL2, a circuit element layer BPL, and a display element layer LDL. Also, the display device 10 may further include a sensor layer PSL.

The display device 10 may be provided in various shapes. For example, the display device 10 may be provided in a rectangular plate shape having two pairs of sides parallel to each other. The display device 10 may display arbitrary visual information, e.g., a text, a video, a picture, a two-dimensional or three-dimensional image, or the like in a direction in which an image is displayed.

The whole or at least a portion of the display device 10 may have flexibility. For example, the display device 10 may have flexibility in the entire area thereof. Alternatively, the display device 10 may have flexibility in an area corresponding to a flexible area, and a bending axis BA may be located in the flexible area. The display device 10 may be a flexible display device which is bendable with respect to the bending axis BA.

The display device 10 may include a display area AA and a non-display area NA. The display area AA is an area in which a plurality of pixels PX (or may be referred to as sub-pixels) are provided, and may be referred to as an active area. In various embodiments, each of the pixels PX may include at least one light emitting device LD. The light emitting device LD may be an organic light emitting diode or a subminiature inorganic light emitting diode having a size in a micro or nano scale range, but the inventive concepts are not limited thereto. The display device 10 drives the pixels PX, corresponding to image data input from the outside, thereby displaying an image in the display area AA.

The non-display area is an area disposed at the periphery of the display area AA, and may be referred to as a non-active area. In various embodiments, the non-display area NA may inclusively mean the other areas except the display area AA on the substrate SUB.

In various embodiments of the inventive concepts, the display device 10 may include a sensor layer PSL which is provided on the opposite surface of one surface of the substrate SUB, on which the first light blocking layer PHL1 is provided. The sensor layer PSL senses incident light. The sensor layer PSL may include a plurality of photo sensors PHS, and the photo sensors PHS may overlap with the display area AA.

In an embodiment of the inventive concepts, the photo sensors PHS may sense light which is emitted from a light source and then reflected by a finger of a user, and sense a fingerprint of the user by analyzing reflected lights L. Hereinafter, in the inventive concepts, the photo sensors PHS being used for fingerprint sensing are described as an example. However, in various embodiments, the photo sensors PHS may be used to perform various functions of a touch sensor, a scanner, or the like.

FIGS. 2A and 2B are plan views illustrating first and second light blocking layers in accordance with various embodiments of the inventive concepts.

In various embodiments of the inventive concepts, the display device 10 may include first and second light blocking layers PHL1 and PHL2. The first and second light blocking layers PHL1 and PHL2 may be disposed in a display panel 110 or be disposed between the display panel 110 and the sensor layer PSL.

Referring to FIGS. 2A and 2B, the first light blocking layer PHL1 may include a light blocking mask M1 and a plurality of first openings PIH1 distributed in the light blocking mask M1. In addition, the second light blocking layer PHL2 may include a light blocking mask M2 and a plurality of second openings PIH2 distributed in the light blocking mask M2.

The light blocking masks M1 and M2 may be made of a light blocking material and/or a light absorbing material. For example, the light blocking masks M1 and M2 may be configured as a metal layer locally opened in areas in which the first and second openings PIH1 and PIH2 are respectively disposed. However, the material constituting the light blocking masks is not limited to metal, and the light blocking masks may be made of various materials capable of blocking transmission of light. For example, the light blocking masks may be made of a black matrix material currently known in the art.

The first and second openings PIH1 and PIH2 may be pin holes distributed in the light blocking masks M1 and M2. That is, each of the first and second openings PIH1 and PIH2 is an empty space opened by removing at least one area of the light blocking masks M1 and M2, and may be a through hole penetrating the light blocking masks M1 and M2. Alternatively, each of the first and second openings PIH1 and PIH2 may be an optical hole formed transparently or translucently to allow only some of incident lights to be selectively transmitted therethrough, and may be light transmission holes.

Although a case where the first and second openings PIH1 and PIH2 are provided in a circular shape is illustrated in FIGS. 2A and 2B, the inventive concepts are not limited thereto. That is, in various embodiments, the first and second openings PIH1 and PIH2 may have various shapes such as a rectangular shape, an elliptical shape, and a polygonal shape. However, the inventive concepts are not limited thereto, and the size, shape, number, resolution and/or arrangement structure of the first and second openings PIH1 and PIH2 may be variously changed. Also, each of the first and second openings PIH1 and PIH2 may be distributed regularly or irregularly in the light blocking masks M1 and M2.

As illustrated in FIG. 2A, the first and second openings PIH1 and PHI2 may have the same shape and size. On the other hand, the first opening PIH1 may have a size greater than that of the second opening PIH2.

Each of the first and second openings PIH1 and PHI2 may provide an optical path of light incident into the sensor layer PSL. The first light blocking layer PHL1 including the first openings PIH1 and the second light blocking layer PHL2 including the second openings PIH2 may selectively block and pass light (hereinafter, referred to as reflected light) L reflected from an object, e.g., a finger in contact with an upper end of the display panel 110.

In some embodiments, some of reflected lights L incident into the first light blocking layer PHL1 may be blocked, and the others may reach the photo sensors PHS by passing through the first openings PIH1. In addition, some of reflected lights L incident into the second light blocking layer PHL2 may be blocked, and the others may reach the photo sensors PHS by passing through the second openings PIH2.

The first and second openings PIH1 and PIH2 may be formed to have sizes and distances, which are appropriate enough to sense a clearer shape of a fingerprint while preventing diffraction of incident light. For example, widths of the first and second openings PIH1 and PIH2 may be set to about ten times or more of that of the wavelength of incident light so as to prevent diffraction of the light. The first openings PIH1 and the second openings PIH2 may have the same size or different sizes. In addition, a distance between the first openings PIH1 may be equal to or different from that between the second openings PIH2.

The distance between the first openings PIH1 may be determined based on a distance between the first light blocking layer PHL1 and the photo sensors PHS, a wavelength of incident light, and a Field of View (FOV) required for the first openings PIH1. Similarly, the distance between the second openings PIH2 may be determined based on a distance between the second light blocking layer PHL2 and the photo sensors PHS, a wavelength of incident light, and an FOV required for the second openings PIH2.

The first and second light blocking layers PHL1 and PHL2 may constitute an optical system configured to allow only some of reflected lights L to be selectively transmitted therethrough and blocking the others. The first and second light blocking layers PHL1 and PHL2 along with the above-described photo sensors PHS may constitute a fingerprint sensor. Also, the first and second light blocking layers PHL1 and PHL2 may be integrally configured with the circuit element layer BPL of the display panel 110. Thus, the module thickness of the display device 10 having a photosensitive type fingerprint sensor can be decreased or minimized.

FIG. 3 is a plan view illustrating an arrangement structure of the pixels PX, the first and second openings PIH1 and PIH2, and the photo sensors PHS in accordance with an embodiment of the inventive concepts. Specifically, FIG. 3 illustrates an embodiment of relative sizes, resolutions, and/or arrangement relationships of the pixels PX, the first and second openings PIH1 and PIH2, and the photo sensors PHS, which are arranged in the display area illustrated in FIG. 1.

In various embodiments of the inventive concepts, the photo sensors PHS may be arranged in the display area AA. The photo sensors PHS may overlap with at least some or all of the pixels PX provided in the display area AA, or be arranged at the periphery of the pixels PX. For example, at least some or all of the photo sensors PHS may be provided between the pixels PX.

In an embodiment in which the photo sensors PHS are provided adjacent to the pixels PX, the photo sensors PHS may use, as a light source, the light emitting device LD provided in at least one pixel PX disposed in the display area AA. Therefore, the photo sensors PHS along with the pixels PX of the display area AA, particularly, the light emitting devices LD provided in the pixels PX may constitute the photosensitive type fingerprint sensor. As described above, when the display device 10 having a built-in fingerprint sensor is implemented by using the pixels PX as a light source without having a separate external light source, the thickness of the display device 10 having the photosensitive type fingerprint sensor can be decreased, and the manufacturing cost of the display device 10 can be reduced.

Referring to FIG. 3, the photo sensors PHS may be arranged such that a number of the photo sensors PHS is greater than those of the first and second openings PIH1 and PIH2 and the pixels PX. At least some of the photo sensors PHS may overlap with the first and second openings PIH1 and PIH2 or overlap with the pixels PX, but the inventive concepts are not limited thereto. For example, some of the photo sensors PHS may be arranged to overlap with the first and second openings PIH1 and PIH2 and the pixels PX, and other some of the photo sensors PHS may be arranged at gaps between the pixels PX.

Referring to FIG. 3, the photo sensors PHS are arranged in the display area AA densely enough not to require one-to-one (1:1) alignment between the pixels PX, between the first openings PIH1, and between the second openings PIH2, and accordingly, occurrence of the moire effect can be prevented or minimized regardless of the alignment of the pixels PX and the first and second openings PIH1 and PIH2.

The arrangement structure of the pixels PX, the first and second openings PIH1 and PIH2, and the photo sensor PHS is not limited to the embodiments illustrated in FIG. 3. For example, the shapes, arrangement forms, relative sizes, numbers, resolutions, and/or mutual arrangement relationships of the pixels PX, the first and second openings PIH1 and PIH2, and the photo sensor PHS may be variously changed.

Although an embodiment in which the first and second openings PIH1 and PIH2 and the photo sensors PHS are arranged in a regular array form in the display area AA is illustrated in FIG. 3, the inventive concepts are not limited thereto. That is, the first and second openings PIH1 and PIH2 and the photo sensors PHS may be irregularly distributed in the display area AA, or be distributed to have different densities or different arrangement structures according to each area or section of the display area AA.

Referring to FIG. 4, the display device 10 in accordance with the embodiment of the inventive concepts may include the display panel 110 and the sensor layer PSL disposed on one surface of the display panel 110.

The display panel 110 may display an image. The type of the display panel 110 is not limited. The display panel 110 may be a self-luminescent display panel such as an Organic Light Emitting Display panel (OLED panel). Alternatively, the display panel 110 may be a non-self-luminescent display panel such as a Liquid Crystal Display panel (LCD panel), an Electro-Phoretic Display panel (EPD panel), or an Electro-Wetting Display panel (EWD panel). When the display panel 110 is configured as the non-self-luminescent display panel, the display device 10 may further include a backlight unit configured to supply light to the display panel 110.

The display panel 110 may include the substrate SUB, the first and second light blocking layers PHL1 and PHL2 provided on one surface (e.g., an upper surface) of the substrate SUB, the circuit element layer BPL, the display element layer LDL, a protective layer PTL, an adhesive layer ADL, and a window WIN. In addition, the display device 10 may further include an additional adhesive layer (not illustrated) (hereinafter, referred to as a second adhesive layer) and an additional protective layer (not illustrated) (hereinafter, referred to as a second protective layer), which are sequentially disposed on the other surface (e.g., a lower surface) of the substrate SUB.

The substrate SUB is a base substrate of the display panel 110, and may be substantially a transparent transmissive substrate. In some embodiments, the substrate SUB may be a rigid substrate including glass or tempered glass, or a flexible substrate including a plastic material.

The flexible substrate may include a film substrate and a plastic substrate, which include a polymer organic material. For example, the flexible substrate may include one of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). However, the material of the substrate SUB is not limited thereto, and the substrate SUB may be made of various materials.

Referring to FIG. 1, the substrate SUB may be bent in a first direction DR1 with respect to the bending axis BA extending along a second direction DR2. The whole or a portion of the substrate SUB may have flexibility. For example, only an area in which the bending axis BA is located in the area of the substrate SUB may have flexibility.

The substrate SUB may include a display area AA and a non-display area NA as illustrated in FIG. 1. In addition, the display area AA may include a plurality of pixel areas PXA in which the pixels PX are respectively disposed and/or formed.

The circuit element layer BPL may be disposed on the second light blocking layer PHL2, and include a plurality of circuit elements constituting pixel circuits of the pixels PX and signal lines configured to supply various power sources and signals configured to drive the pixels PX.

The circuit element layer BPL may include a light transmitting area through which light is transmitted because the circuit elements and the signal lines are not located therein. That is, the light transmitting area is an area between the circuit elements, between the circuit elements and the signal lines, or between the signal lines on a plane, and may mean an area through which light can be transmitted because the circuit elements and the signal lines are not located therein.

In various embodiments of the inventive concepts, the circuit element layer BPL may include multi-layered conductive layers including the circuit elements and the signal lines. Specifically, the circuit element layer BPL may be configured in a multi-layered structure in which layers provided with the circuit elements and the signal lines are stacked.

The light transmitting area may mean an area in which areas in which the circuit elements and the signal lines are not located overlap with each other in the respective layers constituting the multi-layered structure, so that light passes through the multi-layered structure. The light transmitting area may be included in each of the plurality of pixel areas PXA.

Also, the circuit element layer BPL may include at least one insulating layer to electrically insulate the circuit elements and the signal lines.

Also, the circuit element layer BPL may include a line unit (not illustrated) disposed in the non-display area NA of the substrate SUB to supply corresponding power and signal to lines connected to the pixels PX.

The display element layer LDL may be disposed on one surface of the circuit element layer BPL. The display element layer LDL may include a plurality of light emitting devices LD connected to the circuit elements and/or the signal lines of the circuit element layer BPL through contact holes, etc. Each of the light emitting devices LD may be an organic light emitting diode or a subminiature inorganic light emitting device using a structure in which an inorganic crystalline structure is grown. In an embodiment, at least one of the plurality of light emitting devices LD may be disposed in each pixel area PXA.

Each of the pixels PX may include circuit elements disposed on the circuit element layer BPL and at least one light emitting device LD disposed in the display element layer LDL on the circuit element layer BPL. A structure of the pixel PX will be described in detail later.

The protective layer PTL may be disposed on the display element layer LDL to cover the display area AA. The protective layer PTL may include an encapsulation member such as a thin film encapsulation (TFE) or an encapsulation substrate, and additionally include a protective film in addition to the encapsulation member.

The adhesive layer ADL is disposed between the protective layer PTL and the window WIN to couple the protective layer PTL and the window WIN to each other. The adhesive layer may include a transparent adhesive such as an Optically Clear Adhesive (OCA), and include various adhesive materials in addition to the transparent adhesive.

The window WIN is a protective member disposed at a module uppermost portion of the display device 10 including the display panel 110, and may be substantially a transparent transmissive substrate. The window WIN may have a multi-layered structure selected from a glass substrate, a plastic film, and a plastic substrate. The window WIN may include a rigid or flexible substrate, and the material constituting the window WIN is not particularly limited.

In various embodiments of the inventive concepts, the display device 10 may further include a polarizing plate and/or a touch panel (touch electrode layer). For example, the display device 10 may further include a polarizing plate and/or a touch panel, which is disposed between the protective layer PTL and the window WIN.

The second protective layer may be disposed on the other surface of the substrate SUB. The second protective layer may be coupled to the substrate SUB by the second adhesive layer.

The second adhesive layer may firmly couple (or attach) the substrate SUB and the second protective layer to each other. The second adhesive layer may include a transparent adhesive such as an OCA. The second adhesive layer may include a pressure sensitive adhesive (PSA) in which an adhesive material acts when pressure to allow the second adhesive layer to be adhered to an adhesive surface is applied. When the second adhesive layer includes the PSA, the second adhesive layer may be attached to the adhesive surface by using pressure without separate thermal treatment or UV treatment at room temperature.

The second protective layer prevents oxygen and moisture from being introduced thereto from the outside, and may be provided in the form of a single layer or multi-layer. The second protective layer may be configured in a film form, to further ensure flexibility of the display panel 110. The second protective layer may be coupled to the sensor layer PSL through another adhesive layer (not illustrated) including a transparent adhesive such as an OCA.

The first and second light blocking layers PHL1 and PHL2 may be disposed between the display element layer LDL and the sensor layer PSL. For example, the first and second light blocking layers PHL1 and PHL2 may be disposed between the substrate SUB and the circuit element layer BPL as illustrated in FIG. 4. As described with reference to FIG. 2, the first light blocking layer PHL1 may include the first openings PIH1, and the second light blocking layer PHL2 may include the second openings PIH2.

In various embodiments of the inventive concepts, the first openings PIH1 may be provided to overlap with the light transmitting area of the circuit element layer BPL. In addition, the second openings PIH2 may be provided to overlap with the light transmitting area of the circuit element layer BPL. The first openings PIH1 and the second openings PIH2 may overlap with different light transmitting areas. For example, among the light transmitting areas, first light transmitting areas (not illustrated) overlapping with the first openings PIH1 and second light transmitting areas (not illustrated) overlapping with the second openings PIH2 may be located in different areas of the circuit element layer BPL. To overlap may mean to share one or more vertical planes in the DR1 direction.

Because the first and second openings PIH1 and PIH2 are provided to overlap with the light transmitting area of the circuit element layer BPL, reflected light which is emitted from a light source LD and then reflected from a finger of a user, or the like may be introduced into the sensor layer PSL through the first and second openings PIH1 and PIH2.

In order to reduce loss of reflected light L used for fingerprint sensing, the display panel 110 may be configured such that light satisfying a field of view (FOV) (or referred to as a "viewing angle") in a predetermined angle range can be transmitted through the first and second openings PIH1 and PIH2.

The sensor layer PSL may be disposed to overlap with the display panel 110 in at least the display area AA. A distance between the photo sensors PHS included in the sensor layer PSL may be densely set such that reflected light L reflected from an object to be observed (e.g., a specific area of a finger, such as a fingerprint area) can be incident into at least two adjacent photo sensors PHS.

Light of varying characteristics such as color, magnitude, frequency, and/or wavelength may be generated by the display element layer LDL and emitted through a window WIN to a surface of the display device 10. Prior to and during fingerprint interaction with the window WIN emitted light is reflected back towards the substrate SUB.

The photo sensors PHS of the sensor layer PSL may output, as sensing signals, electrical signals corresponding to reflected lights L received by passing through the first and second openings PIH1 and PIH2. The reflected lights L received by the respective photo sensors PHS may have different optical characteristics (e.g., different frequencies, different wavelengths, different magnitudes, etc.) according to whether the reflected lights L are caused by valleys or ridges of a fingerprint formed at a finger of a user. Therefore, the photo sensors PHS may output sensing signals (or electrical signals) having different electrical characteristics, corresponding to the optical characteristics of the reflected lights L. The sensing signals output by the photo sensors PHS may be converted into image data to be used to identify the fingerprint of the user.

A fingerprint sensing method of the display device 10 in accordance with the embodiment of the inventive concepts will be briefly described as follows. During a fingerprint sensing period in which the photo sensors PHS are activated, the pixels PX (particularly, the light emitting devices LD provided in the pixels PX) of the display area AA may emit lights in a state in which a finger (e.g., a fingerprint region) of a user is in contact with or approaches the display area AA. For example, all the pixels PX of the display area AA may simultaneously or sequentially emit light during the fingerprint sensing period. Alternatively, only some pixels PX among the pixels PX of the display area AA may emit lights at a predetermined distance, or only some pixels PX emitting light of a specific color (e.g., light of a short wavelength band such as blue light) among the pixels PX of the display area AA may selectively emit lights.

Some of the lights emitted from the pixels PX may be reflected from the finger of the user to be incident into the photo sensors PHS by passing through the first and second openings PIH1 and PIH2. A fingerprint shape (fingerprint pattern) of the user may be detected based on light amount differences and/or wavelengths of reflected lights L reflected from ridges and valleys of the fingerprint.

Meanwhile, in the display device 10, the light emitting devices LD of the pixels PX are used as a light source of a fingerprint sensor, but the inventive concepts are not limited thereto. For example, in another embodiment of the inventive concepts, the display device 10 may have a separate light source configured to sense fingerprints.

The display device 10 in accordance with the embodiment of the inventive concepts may include a driving circuit configured to drive the display panel 110. For example, the driving circuit may output a data signal corresponding to image data to the display panel 110 or output a driving signal for the photo sensors PHS, and receive sensing signals received from the photo sensors PHS. The driving circuit may detect a fingerprint shape of a user by using the sensing signals.

In various embodiments of the inventive concepts, the driving circuit may include a panel driver (not illustrated) and a fingerprint detector (not illustrated). The panel driver may supply a data signal corresponding to image data to the pixels PX by sequentially scanning the pixels PX of the display area AA. Then, the display panel 110 may display an image corresponding to the image data.

In some embodiments, the panel driver may supply a driving signal configured for fingerprint sensing to the pixels PX. The driving signal may be provided to allow the pixels PX to operate as a light source for the photo sensors PHS by emitting lights.

The fingerprint detector may transfer, to the photo sensors PH, a driving signal configured to drive the photo sensors PHS, and detect a fingerprint of a user, based on sensing signals received from the photo sensors PHS.

Figure 5B:
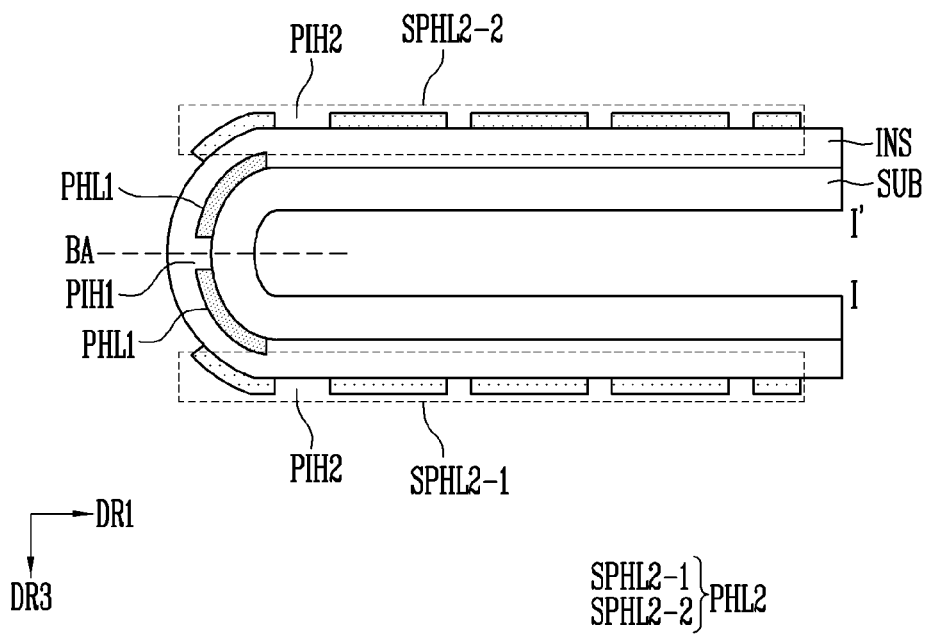
FIG. 5A is a sectional view taken along line I-I' illustrated in FIG. 2, and FIGS. 5B and 5C are sectional views taken along the line I-I' illustrated in FIG. 2 when the display device is bent.
Figure 5C:
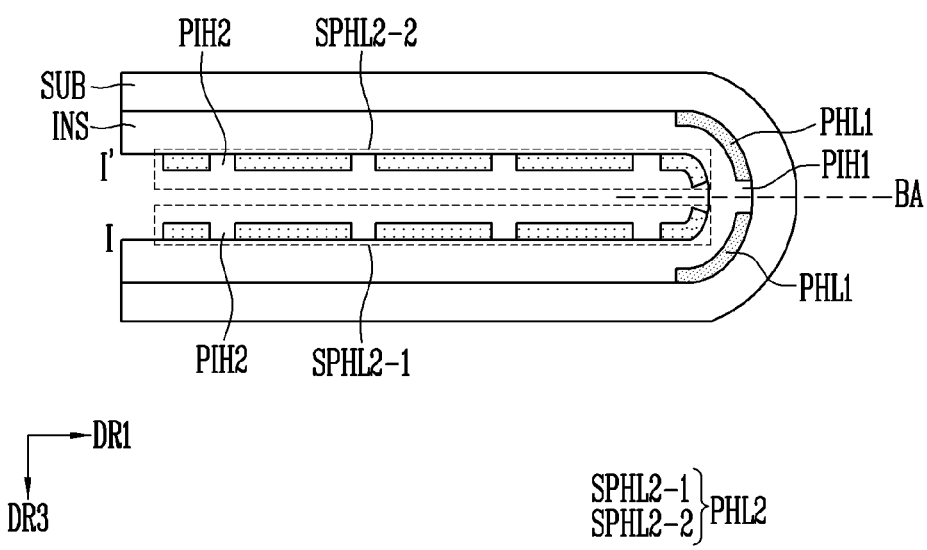

FIG. 5A is a sectional view taken along line I-I' illustrated in FIG. 2A, and FIGS. 5B and 5C are sectional views taken along the line I-I' illustrated in FIG. 2A when the display device is bent. Specifically, FIG. 5B illustrates a case where the display device 10 is bent such that the substrate SUB is located at the inside, and FIG. 5C illustrates a case where the display device 10 is bent such that an insulating layer INS is located at the inside compared to the substrate SUB that is on the outside.

Referring to FIGS. 2 and 4 to 5C, the display device 10 in accordance with embodiments of the inventive concepts may include the substrate SUB, the first light blocking layer PHL1, the second light blocking layer PHL2 including second sub-light blocking layers SPHL2-1 and SPHL2-2, the circuit element layer BPL, and the display element layer LDL.

Referring to FIGS. 2, 4 and 5A to 5C, the first light blocking layer PHL1 may be provided between the substrate SUB and the circuit element layer BPL, and the second light blocking layer PHL2 may be provided between the first light blocking layer PHL1 and the circuit element layer BPL. Specifically, the first light blocking layer PHL1 may be provided on one surface of the substrate SUB, and the insulating layer INS may be provided on the one surface of the substrate SUB, on which the first light blocking layer PHL1 is provided. As illustrated in FIGS. 5A to 5C the insulating layer INS may encompass portions of the first light blocking layer PHL1.

The insulating layer INS may include any one of an inorganic insulating material and an organic insulating material. The second light blocking layer PHL2 may be provided on the insulating layer INS. That is, the first light blocking layer PHL1 and the second light blocking layer PHL2 may be provided in different layers on the substrate SUB.

In an embodiment of the inventive concepts, the second light blocking layer PHL2 may include second sub-light blocking layers SPHL2-1 and SPHL2-2 which are disposed to be spaced apart from each other along the first direction DR1 and each has second openings PIH2. First openings PIH1 of the first light blocking layer PHL1 may overlap with an area between the second sub-light blocking layers SPHL2-1 and SPHL2-2. In addition, portions of the second openings PIH2 of each of the second sub-light blocking layers SPHL2-1 and SPHL2-2 may be provided not to overlap with the first light blocking layer PHL1.

Referring to FIGS. 2, 4, and 5A to 5C, the first openings PIH1 of the first light blocking layer PHL1 may be located in an area A1 in which the second sub-light blocking layers SPHL2-1 and SPHL2-2 are spaced apart from each other. The area A1 may be another opening in the second light blocking layer PHL2. The second openings PIH2 of (2-1)th and (2-2)th sub-light blocking layers SPHL2-1 and SPHL2-2 may be disposed not to overlap with the first light blocking layer PHL1. Accordingly, light can pass through the area between the second sub-light blocking layers SPHL2-1 and SPHL2-2, the first openings PIH1, and the second openings PIH2. For example, light emitted from the light source may be reflected by a finger of a user and then pass the area between the second sub-light blocking layers SPHL2-1 and SPHL2-2, the first openings PIH1, and the second openings PIH2.

In an embodiment of the inventive concepts, a portion of the first light blocking layer PHL1 may overlap with a portion of each of the second sub-light blocking layers SPHL2-1 and SPHL2-2. As illustrated in FIGS. 5A to 5C, one end portion of the first light blocking layer PHL1 may overlap with one end portion of the (2-1)th sub-light blocking layer SPHL2-1, and the other end portion of the first light blocking layer PHL1 may overlap with one end portion of the (2-2)th sub-light blocking layer SPHL2-2.

A portion of the first light blocking layer PHL1 may overlap with a portion of each of the second sub-light blocking layers SPHL2-1 and SPHL2-2, so that light can pass through only the first and second openings PIH1 and PIH2. For example, some of reflected lights L reflected by a finger of a user may pass through the first and second openings PIH1 and PIH2, and the others may be blocked by the light blocking masks of the first and second light blocking layers PHL1 and PHL2. In addition, an area with which the portion of the first of the first light blocking layer PHL1 and the portion of each of the second sub-light blocking layers SPHL2-1 and SPHL2-2 overlap with each other may be set such that reflected light L can pass through pass through only the first and second openings PIH1 and PIH2 when the display device 10 is bent.

In an embodiment of the inventive concepts, the second sub-light blocking layers SPHL2-1 and SPHL2-2 adjacent to the bending axis BA may be spaced apart from each other with the bending axis BA interposed therebetween. That is, the second light blocking layer PHL2 including the second sub-light blocking layers SPHL2-1 and SPHL2-2 may not overlap with the bending axis BA.

As illustrated in FIGS. 5B and 5C, the second sub-light blocking layers SPHL2-1 and SPHL2-2 are provided not to overlap with the bending axis BA, so that bending stress formed in the second light blocking layer PHL2 when the display device 10 is bent can be minimized. Accordingly, the second light blocking layer PHL2 can be prevented from being deformed or damaged even when the display device 10 is repeatedly bent.

In an embodiment of the inventive concepts, the first openings PIH1 of the first light blocking layer PHL1 may be disposed to overlap with the bending axis BA. As illustrated in FIG. 5A, because the first light blocking layer PHL1 overlaps with the bending axis BA, bending stress may be formed in the first light blocking layer PHL1 when the display device 10 is bent. However, in an embodiment of the inventive concepts, the first openings PIH1 are provided to overlap with the bending axis BA, so that bending stress formed in the first light blocking layer PHL1 can be minimized. Specifically, when the first openings PIH1 overlap with an area of the bending axis BA, in which the largest bending stress is formed when the display device 10 is bent, the area with which the area of the bending axis BA and the first light blocking layer PHL1 are in contact with each other can be minimized. Accordingly, the first light blocking layer PHL1 can be prevented from being deformed or damaged even when the display device 10 is repeatedly bent.

Figure 6:
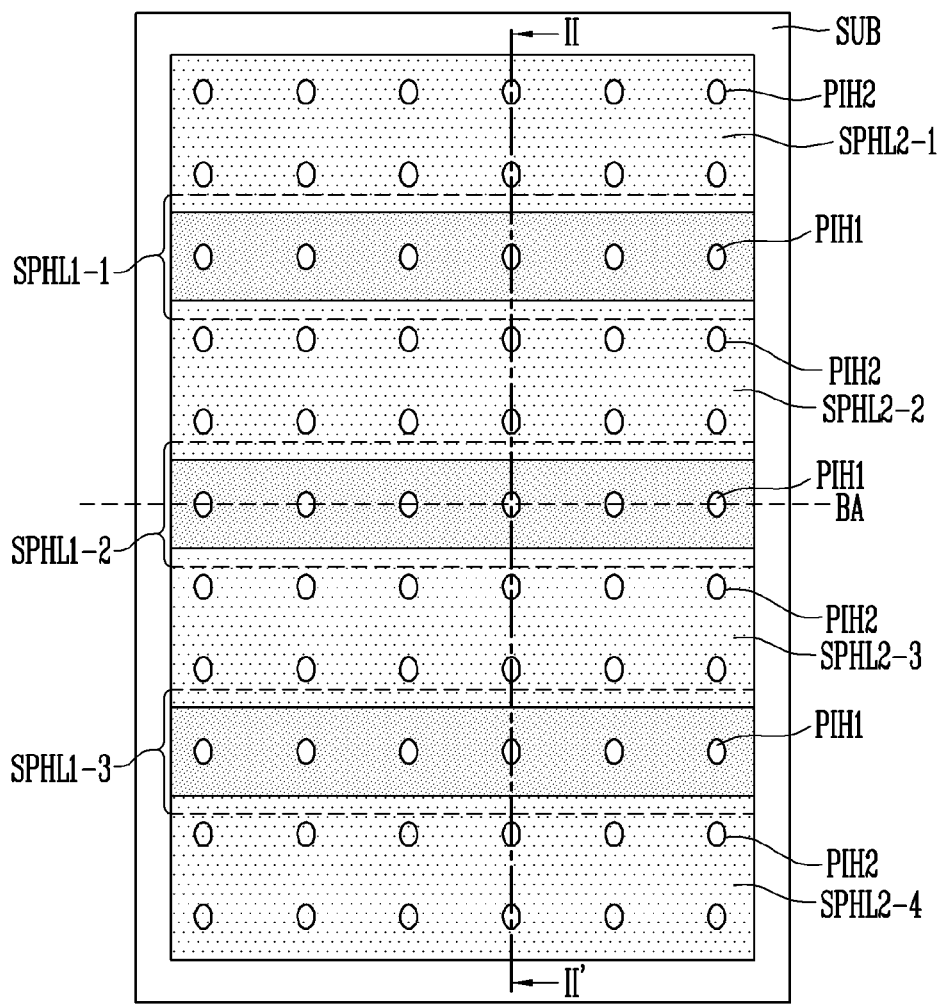
FIG. 6 is a plan view illustrating first and second light blocking layers in accordance with another embodiment of the inventive concepts.
Figure 7B:
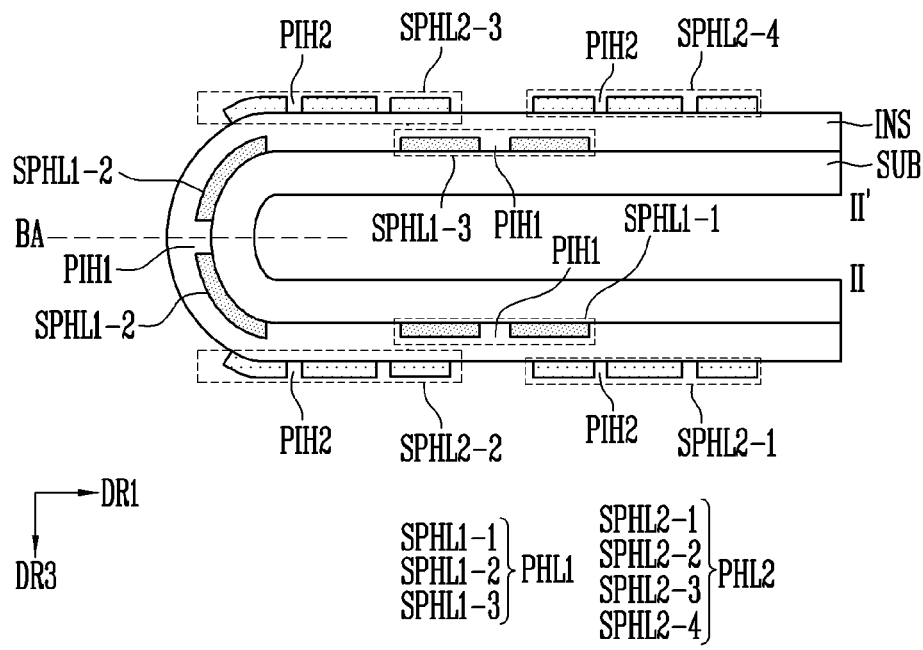
FIG. 7A is a sectional view taken along line II-II' illustrated in FIG. 6, and FIGS. 7B and 7C are sectional views taken along the line II-II' illustrated in FIG. 6 when the display device is bent.
Figure 7C:
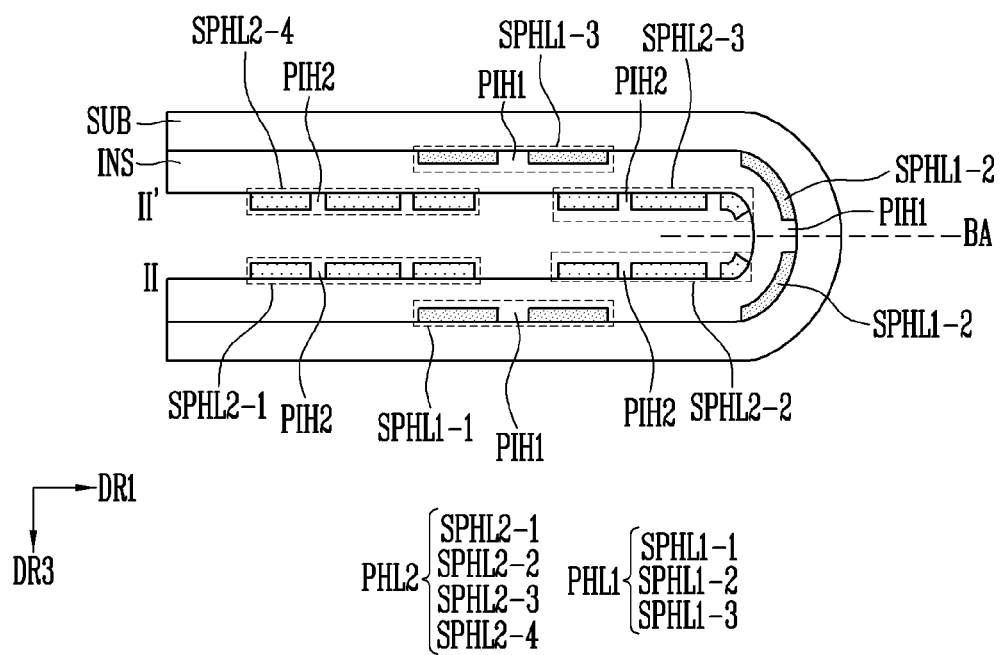

FIG. 6 is a plan view illustrating first and second light blocking layers in accordance with another embodiment of the inventive concepts. FIG. 7A is a sectional view taken along line II-II' illustrated in FIG. 6, and FIGS. 7B and 7C are sectional views taken along the line II-II' illustrated in FIG. 6 when the display device is bent. Specifically, FIG. 7B illustrates a case where the display device 10 is bent such that the substrate SUB is located at the inside, and FIG. 7C illustrates a case where the display device 10 is bent such that the insulating layer INS is located at the inside.

In this embodiment, components which are not mentioned in the above-described embodiment will be mainly described to avoid redundancy. Portions not particularly described in this embodiment follow those of the above-described embodiment. In addition, identical reference numerals refer to identical components, and similar reference numerals refer to similar components. This is the same as embodiments which will be described later.

Referring to FIGS. 4 and 6 to 7C, the display device 10 in accordance with the embodiment of the inventive concepts may include the substrate SUB, the first light blocking layer PHL1 including first sub-light blocking layers SPHL1-1 to SPHL1-3, the second light blocking layer PHL2 including second sub-light blocking layers SPHL2-1 to SPHL2-4, the circuit element layer BPL, and the display element layer LDL.

The first light blocking layer PHL1 may include the first sub-light blocking layers SPHL1-1 to SPHL1-3 which are disposed to be spaced apart from each other along the first direction DR1 and each having first openings PIH1.

Although a case where three first sub-light blocking layers SPHL1-1 to SPHL1-3 and four second sub-light blocking layers SPHL2-1 to SPHL2-4 are provided on the substrate SUB is illustrated in FIGS. 6 to 7C, the numbers of the first sub-light blocking layers SPHL1-1 to SPHL1-3 and the second sub-light blocking layers SPHL2-1 to SPHL2-4, which are provided on the substrate SUB, are not limited thereto. For example, four first sub-light blocking layers SPHL1 and five second sub-light blocking layers SPHL2 may be provided on the substrate SUB.

In an embodiment of the inventive concepts, at least a portion of one of the first sub-light blocking layers SPHL1-1 to SPHL1-3 and at least a portion of one of the second sub-light blocking layers SPHL2-1 to SPHL2-4 may overlap with each other in the DR3 direction. Specifically, portions of the first sub-light blocking layer SPHL1 and the second sub-light blocking layer SPHL2, which are adjacent to each other, may overlap with each other.

As illustrated in FIGS. 7A to 7C, the second light blocking layer PHL2 may include (2-1)th to (2-4)th sub-light blocking layers SPHL2-1 to SPHL2-4 spaced apart from each other along the first direction DR1. The first light blocking layer PHL1 may include (1-1)th to (1-3)th sub-light blocking layers SPHL1-1 to SPHL1-3 spaced apart from each other along the first direction DR1. The spaced apart areas are also openings through which light may pass.

One end portion EP2$a$ of the (2-1)th sub-light blocking layer SPHL2-1 may overlap with one end portion EP1$a$ of the (1-1)th sub-light blocking layer SPHL1-1, and the other end portion EP2$a$ of the (1-1)th sub-light blocking layer SPHL1-1 may overlap with one end portion EP2$b$ of the (2-2)th sub-light blocking layer SPHL2-2. The other end portion EP2$c$ of the (2-2)th sub-light blocking layer SPHL2-2 may overlap with one end portion EP1$c$ of the (1-2)th sub-light blocking layer SPHL1-2, and the other end portion EP1$d$ of the (1-2)th sub-light blocking layer SPHL1-2 may overlap with one end portion EP2$d$ of the (2-3)th sub-light blocking layer SPHL2-3. The other end portion EP2$e$ of the (2-3)th sub-light blocking layer SPHL2-3 may overlap with one end portion EP1$e$ of the (1-3)th sub-light blocking layer SPHL1-3, and the other end portion EP1$f$ of the (1-3)th sub-light blocking layer SPHL1-3 may overlap with one end portion EP2$f$ of the (2-4)th sub-light blocking layer SPHL2-4.

The portions of the first sub-light blocking layer SPHL1 and the second sub-light blocking layer SPHL2, which are adjacent to each other, are provided to overlap with each other, so that reflected light L can be selectively transmitted through only the first and second openings PIH1 and PIH2.

In an embodiment of the inventive concepts, the first openings PIH1 of each of the first sub-light blocking layers SPHL1-1 to SPHL1-3 may be provided not to overlap with the second sub-light blocking layers SPHL2-1 to SPHL2-4, and the second openings PIH2 of each of the second sub-light blocking layers SPHL2-1 to SPHL2-4 may be provided not to overlap with the first sub-light blocking layers SPHL1-1 to SPHL1-3.

Referring to FIGS. 6 to 7C, an area A2 in which the (2-1)th sub-light blocking layer SPHL2-1 and the (2-2)th sub-light blocking layer SPHL2-2 are spaced apart from each other and the first openings PIH1 of the (1-1)th sub-light blocking layer SPHL1-1 may overlap with each other. An area A3 in which the (2-2)th sub-light blocking layer SPHL2-2 and the (2-3)th sub-light blocking layer SPHL2-3 are spaced apart from each other and the first openings PIH1 of the (1-2)th sub-light blocking layer SPHL1-2 may overlap with each other. An area A4 in which the (2-3)th sub-light blocking layer SPHL2-3 and the (2-4)th sub-light blocking layer SPHL2-4 are spaced apart from each other and the first openings PIH1 of the (1-3)th sub-light blocking layer SPHL1-3 may overlap with each other.

In addition, an area A5 in which the (1-1)th sub-light blocking layer SPHL1-1 and the (1-2)th sub-light blocking layer SPHL1-2 are spaced apart from each other and the second openings PIH2 of the (2-2)th sub-light blocking layer SPHL2-2 may overlap with each other. An area A6 in which the (1-2)th sub-light blocking layer SPHL1-2 and the (1-3)th sub-light blocking layer SPHL1-3 are spaced apart from each other and the second openings PIH2 of the (2-3)th sub-light blocking layer SPHL2-3 may overlap with each other.

Accordingly, light may pass through the respective areas A2, A3, and A4 between the second sub-light blocking layers SPHL2-1 to SPHL2-4 and the first openings PIH1, and pass through the respective areas A5 and A6 between the first sub-light blocking layers SPHL1-1 to SPHL1-3 and the second openings PIH2. For example, light emitted from the light source may be reflected by a finger of a user and then pass through the respective areas A2, A3, and A4 between the second sub-light blocking layers SPHL2-1 to SPHL2-4 and the first openings PIH1, and the respective areas A5 and A6 between the first sub-light blocking layers SPHL1-1 to SPHL1-3 and the second openings PIH2.

In an embodiment of the inventive concepts, the second sub-light blocking layers SPHL2-1 to SPHL2-4 may not overlap with the bending axis BA. As illustrated in FIGS. 6 to 7C, the (2-2)th sub-light blocking layer SPHL2-2 and the (2-3)th sub-light blocking layer SPHL2-3 may be spaced apart from each other with the bending axis BA interposed therebetween. In addition, the (2-2)th sub-light blocking layer SPHL2-2 may be spaced apart from the (2-1)th sub-light blocking layer SPHL2-1 along the first direction DR1, and the (2-3)th sub-light blocking layer SPHL2-3 may be spaced apart from the (2-4)th sub-light blocking layer SPHL2-4 along the first direction DR1.

The (2-2)th and (2-3)th sub-light blocking layers SPHL2-2 and SPHL2-3 adjacent to the bending axis BA and the (2-1)th and (2-4)th sub-light blocking layers SPHL2-1 and SPHL2-4 distant from the bending axis BA are spaced apart from each other, so that bending stress formed in the (2-2)th and (2-3)th sub-light blocking layers SPHL2-2 and SPHL2-3 when the display device 10 is bent can be effectively suppressed from being transferred to the (2-1)th and (2-4)th sub-light blocking layers SPHL2-1 and SPHL2-4. Accordingly, bending stress formed in the second light blocking layer PHL2 when the display device 10 is bent can be further minimized.

In an embodiment of the inventive concepts, the first openings PIH1 of the first sub-light blocking layer SPHL1 most adjacent to the bending axis BA may overlap with the bending axis BA. As illustrated in FIGS. 6 to 7C, the first openings PIH1 of the (1-2)th sub-light blocking layer SPHL1-2 may overlap with the bending axis BA. Accordingly, bending stress formed in the (1-2)th sub-light blocking layer SPHL1-2 adjacent to the bending axis BA can be minimized.

The (1-2)th sub-light blocking layer SPHL1-2 are spaced apart from the (1-1)th and (1-3)th sub-light blocking layers SPHL1-1 and SPHL1-3, so that bending stress formed in the (1-2)th sub-light blocking layer SPHL1-2 when the display device 10 is bent can be prevented from being transferred to the (1-1)th and (1-3)th sub-light blocking layers SPHL1-1 and SPHL1-3.

Figure 8:
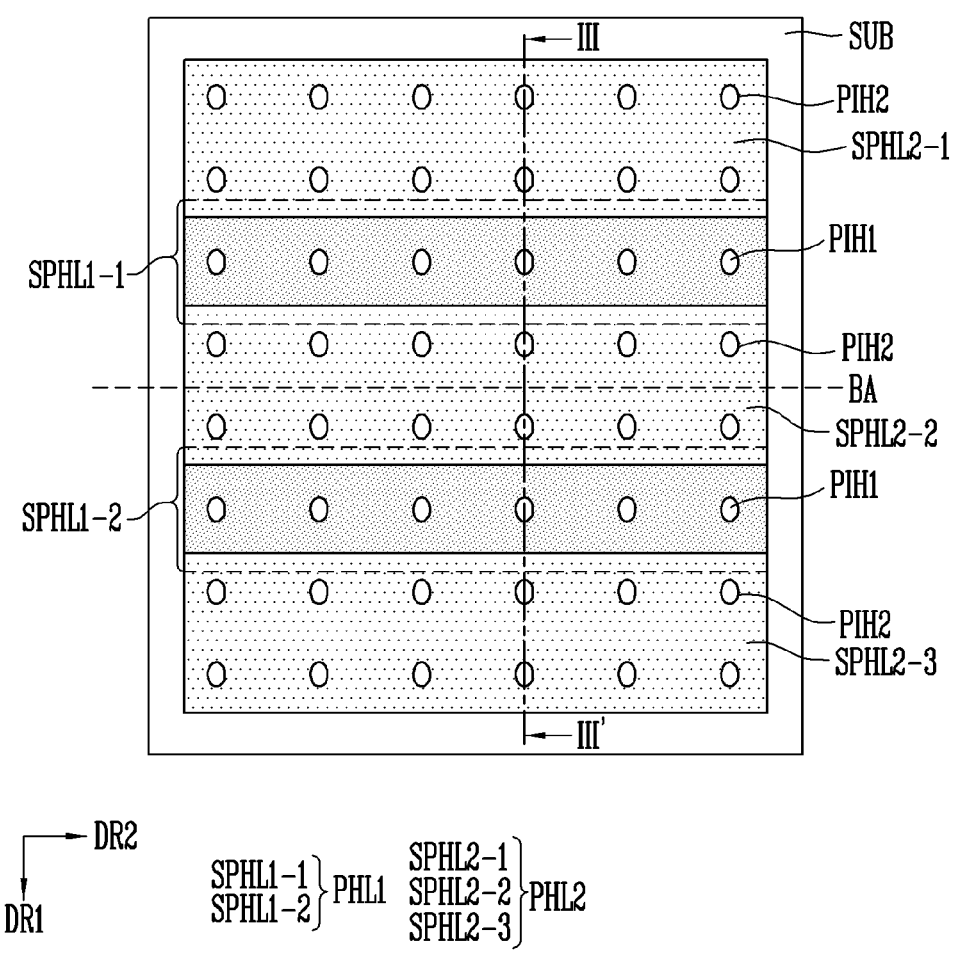
FIG. 8 is a plan view illustrating first and second light blocking layers in accordance with still another embodiment of the inventive concepts.
Figure 9B:
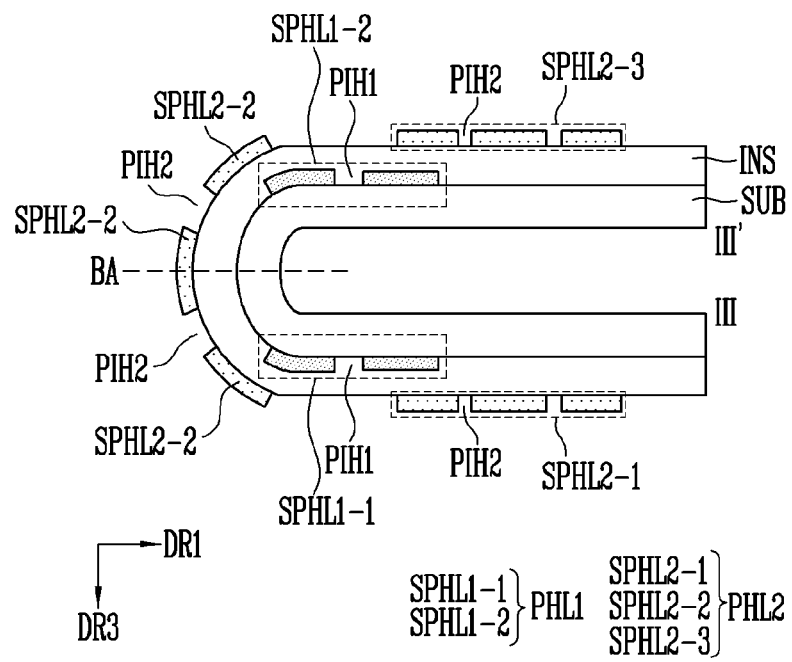
FIG. 9A is a sectional view taken along line III-III' illustrated in FIG. 8, and FIGS. 9B and 9C are sectional views taken along the line III-III' illustrated in FIG. 8 when the display device is bent.
Figure 9C:
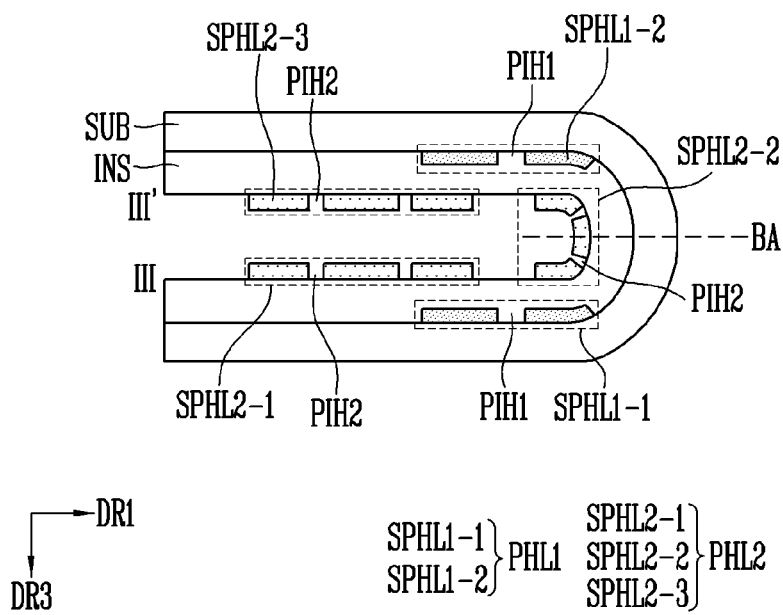

FIG. 8 is a plan view illustrating first and second light blocking layers in accordance with still another embodiment of the inventive concepts. FIG. 9A is a sectional view taken along line III-III' illustrated in FIG. 8, and FIGS. 9B and 9C are sectional views taken along the line III-III' illustrated in FIG. 8 when the display device is bent. Specifically, FIG. 9B illustrates a case where the display device 10 is bent such that the substrate SUB is located at the inside, and FIG. 9C illustrates a case where the display device 10 is bent such that the insulating layer INS is located at the inside.

Referring to FIGS. 4 and 8 to 9C, the display device 10 in accordance with the embodiment of the inventive concepts may include the substrate SUB, the first light blocking layer PHL1 including first sub-light blocking layers SPHL1-1 and SPHL1-2, the second light blocking layer PHL2, the circuit element layer BPL, and the display element layer LDL.

Although a case where (1-1)th and (1-2)th sub-light blocking layers SPHL1-1 and SPHL1-2 and (2-1)th to (2-3)th sub-light blocking layers SPHL2-1 to SPHL2-3 are provided on the substrate SUB is illustrated in FIGS. 8 to 9C, the configurations of the first light blocking layer PHL1 and the second light blocking layer PHL2 are not limited thereto. For example, unlike FIGS. 8 to 9C, the second light blocking layer PHL2 may include only the (2-2)th sub-light blocking layer SPHL2-2 adjacent to the bending axis BA, the (1-1)th sub-light blocking layer SPHL1-1 may extend to overlap with an area in which the (2-1)th sub-light blocking layer SPHL2-1 is provided, and the (1-2)th sub-light blocking layer SPHL1-2 may extend to overlap with an area in which the (2-3)th sub-light blocking layer SPHL2-3 is provided.

Although a case where two first sub-light blocking layers SPHL1-1 and SPHL1-2 and three second sub-light blocking layers SPHL2-1 to SPHL2-3 are provided on the substrate SUB is illustrated in FIGS. 8 to 9C, the numbers of the first sub-light blocking layers SPHL1-1 and SPHL1-2 and the second sub-light blocking layers SPHL2-1 to SPHL2-3, which are provided on the substrate SUB, are not limited thereto. For example, three first sub-light blocking layers SPHL1 and four second sub-light blocking layers SPHL2 may be provide on the substrate SUB.

In an embodiment of the inventive concepts, the first light blocking layer PHL1 may include the first sub-light blocking layers SPHL1-1 and SPHL1-2 which are disposed to be spaced apart from each other along the first direction DR1 and each has first openings PIH1. Second openings PIH2 of the second light blocking layer PHL2 may overlap with an area A7 between the first sub-light blocking layers SPHL1-1 and SPHL1-2. In addition, the second light blocking layer PHL2 may include the second sub-light blocking layers SPHL2-1 to SPHL2-3 which are disposed to be spaced apart from each other and each has second openings PIH2.

Hereinafter, an embodiment in which the second light blocking layer PHL2 includes the second sub-light blocking layers SPHL2-1 to SPHL2-3 will be described.

In an embodiment of the inventive concepts as illustrated in FIG. 9A, the first sub-light blocking layers SPHL1-1 and SPHL1-2 adjacent to the bending axis BA may be spaced apart from each other by the area A7 with the bending axis BA interposed therebetween. When the display device 10 is bent, bending stress increases as the radius of curvature becomes smaller. For example, when the first light blocking layer PHL1 is provided on the substrate SUB to overlap with the bending axis BA, and the second light blocking layer PHL2 is provided on the insulating layer INS to overlap with the bending axis BA, bending stress formed in the first light blocking layer PHL1 may be greater than that formed in the second light blocking layer PHL2 when the display device 10 is bent.

In an embodiment of the inventive concepts, the first sub-light blocking layers SPHL1-1 and SPHL1-2 included in the first light blocking layer PHL1 are provided to be spaced apart from each other with the bending axis BA interposed therebetween, so that the bending stress formed in the first light blocking layer PHL1 when the display device 10 is bent can be minimized.

As illustrated in FIGS. 8 to 9C, the second openings PIH2 of each of the second sub-light blocking layers SPHL2-1 to SPHL2-3 may be located in an area A7 in which the first sub-light blocking layers SPHL1-1 and SPHL1-2 are spaced apart from each other. Specifically, the second openings PIH2 of the (2-2)th sub-light blocking layer SPHL2-2 may be located in the area A7 in which the first sub-light blocking layers SPHL1-1 and SPHL1-2 are spaced apart from each other.

In an embodiment of the inventive concepts, some of the second openings PHI2 of the second light blocking layer PHL2 may be disposed to overlap with the bending axis BA. Unlike as illustrated in FIGS. 8 to 9C, some of the second openings PIH2 of the (2-2)th sub-light blocking layer SPHL2-2 adjacent to the bending axis BA may be provided to overlap with the bending axis BA.

In an embodiment of the inventive concepts, at least a portion of one of the first sub-light blocking layers SPHL1-1 and SPHL1-2 and at least a portion of one of the second sub-light blocking layers SPHL2-1 to SPHL2-3 may overlap with each other. Specifically, portions of the first sub-light blocking layer SPHL1 and the second sub-light blocking layer SPHL2, which are adjacent to each other, may overlap with each other.

As illustrated in FIGS. 9A to 9C, one end portion DP2a of the (2-1)th sub-light blocking layer SPHL2-1 may overlap with one end portion DP1a of the (1-1)th sub-light blocking layer SPHL1-1, and the other end portion DP1b of the (1-1)th sub-light blocking layer SPHL1-1 may overlap with one end portion DP2b of the (2-2)th sub-light blocking layer SPHL2-2. The other end portion DP2c of the (2-2)th sub-light blocking layer SPHL2-2 may overlap with one end portion DP1c of the (1-2)th sub-light blocking layer SPHL1-2, and the other end portion DP1d of the (1-2)th sub-light blocking layer SPHL1-2 may overlap with one end portion DP2d of the (2-3)th sub-light blocking layer SPHL2-3.

In an embodiment of the inventive concepts, the first openings PIH1 of each of the first sub-light blocking layers SPHL1-1 and SPHL1-2 may be provided not to overlap with the second sub-light blocking layers SPHL2-1 to SPHL2-3, and the second openings PIH2 of each of the second sub-light blocking layers SPHL2-1 to SPHL2-3 may be provided not to overlap with the first sub-light blocking layers SPHL1-1 and SPHL1-2.

Referring to FIGS. 8 to 9C, an area A8 in which the (2-1)th sub-light blocking layer SPHL2-1 and the (2-2)th sub-light blocking layer SPHL2-2 are spaced apart from each other and the first openings PIH1 of the (1-1)th sub-light blocking layer SPHL1-1 may overlap with each other. An area A9 in which the (2-2)th sub-light blocking layer SPHL2-2 and the (2-3)th sub-light blocking layer SPHL2-3 are spaced apart from each other and the first openings PIH1 of the (1-2)th sub-light blocking layer SPHL1-2 may overlap with each other. In addition, the area A7 in which the (1-1)th sub-light blocking layer SPHL1-1 and the (1-2)th sub-light blocking layer SPHL1-2 are spaced apart from each other and the second openings PIH2 of the (2-2)th sub-light blocking layer SPHL2-2 may overlap with each other.

In an embodiment of the inventive concepts, the first sub-light blocking layers SPHL1-1 and SPHL1-2 may not overlap with the bending axis BA. In addition, the first sub-light blocking layers SPHL1 are spaced apart from each other along the first direction DR1, so that bending stress formed in the first sub-light blocking layer most adjacent to the bending axis BA can be prevented from being transferred to the first sub-light blocking layer SPHL1 located most distant from the bending axis BA.

Figure 10:
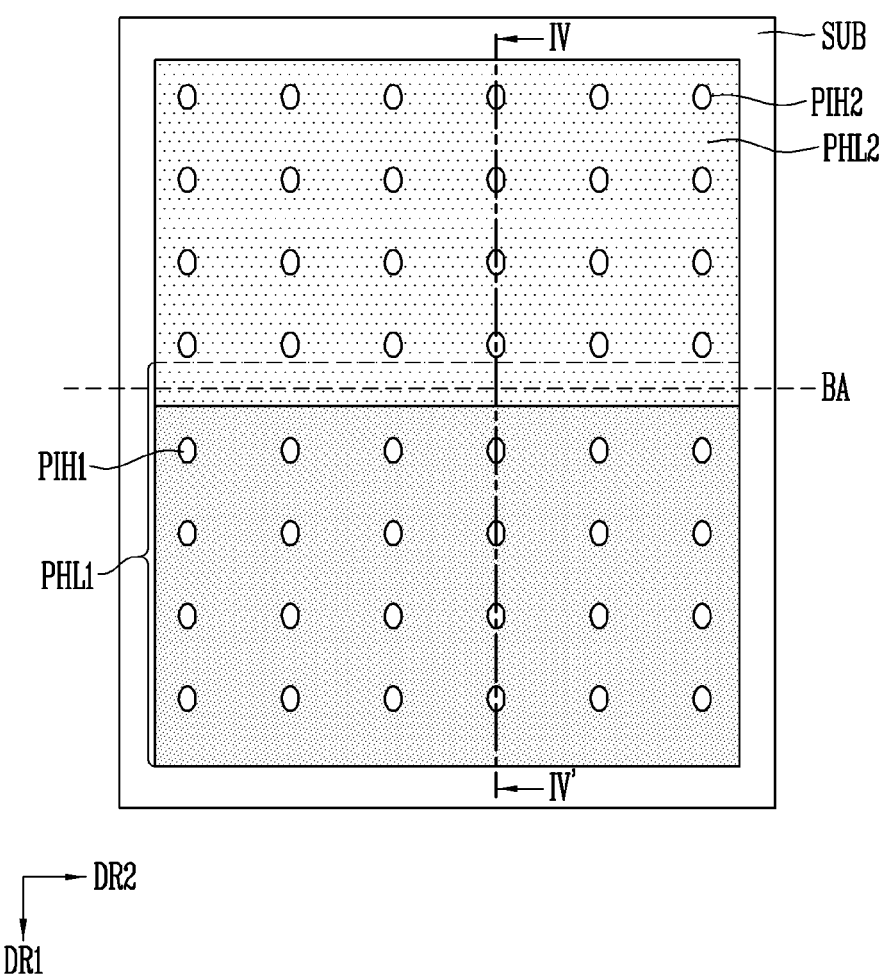
FIG. 10 is a plan view illustrating first and second light blocking layers in accordance with still another embodiment of the inventive concepts.
Figure 11B:
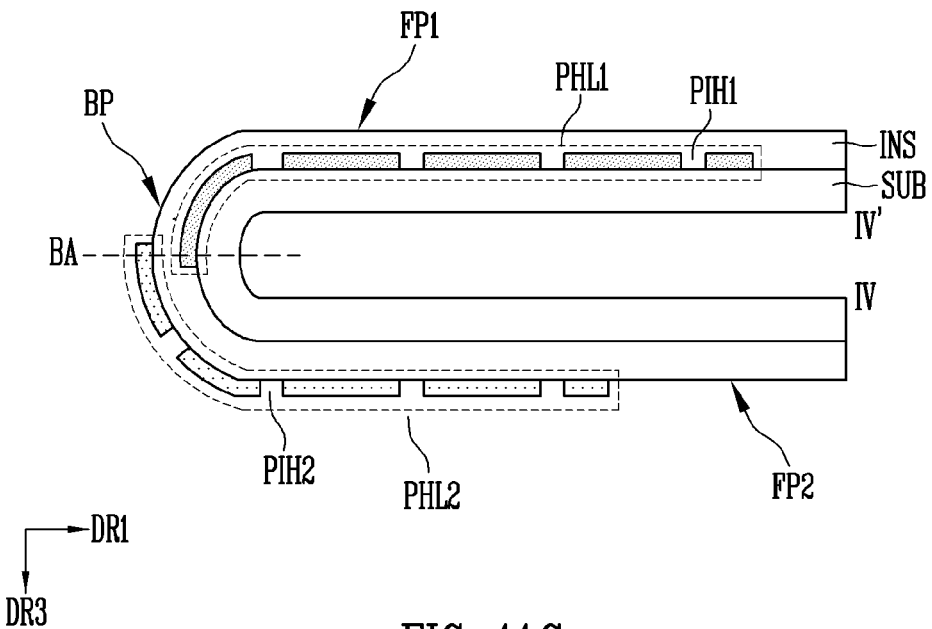
FIG. 11A is a sectional view taken along line IV-IV' illustrated in FIG. 10, and FIGS. 11B and 11C are sectional views taken along the line IV-IV' illustrated in FIG. 10 when the display device is bent.
Figure 11C:
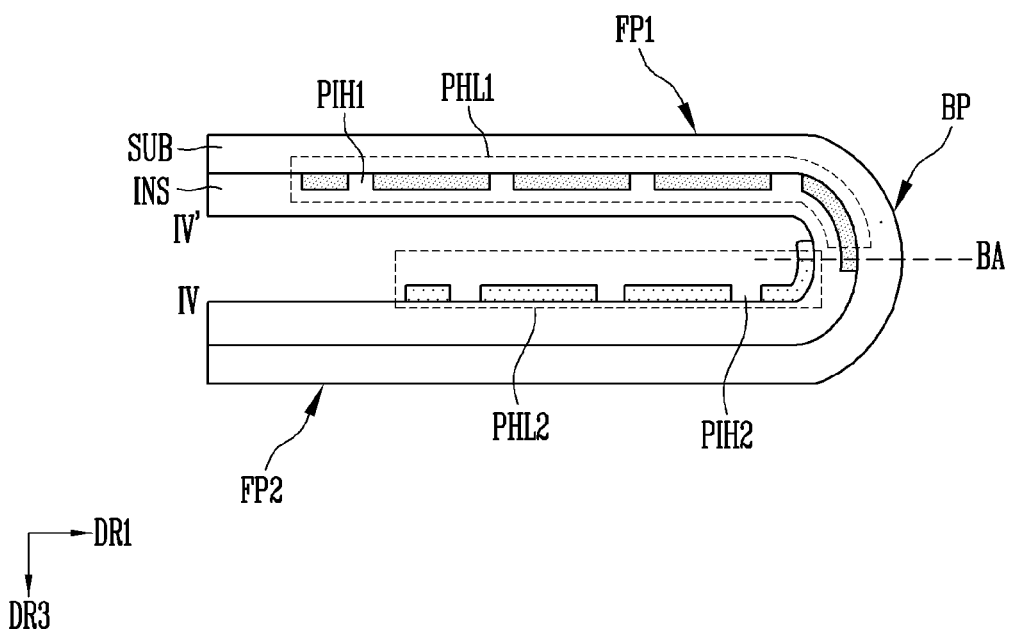

FIG. 10 is a plan view illustrating first and second light blocking layers in accordance with still another embodiment of the inventive concepts. FIG. 11A is a sectional view taken along line IV-IV' illustrated in FIG. 10, and FIGS. 11B and 11C are sectional views taken along the line IV-IV' illustrated in FIG. 10 when the display device is bent. Specifically, FIG. 11B illustrates a case where the display device 10 is bent such that the substrate SUB is located at the inside, and FIG. 11C illustrates a case where the display device 10 is bent such that the insulating layer INS is located at the inside.

Referring to FIGS. 4 and 10, the display device 10 in accordance with the embodiment of the inventive concepts may include the substrate SUB, the first light blocking layer PHL1, the second light blocking layer PHL2, the circuit element layer BPL, and the display element layer LDL.

A portion CP1 of at least one of the first light blocking layer PHL1 and a portion CP2 of the second light blocking layer PHL2 may overlap at or near the bending axis BA. For example, the portion CP1 of the first light blocking layer PHL1 may overlap with the bending axis BA, the portion CP2 of the second light blocking layer PHL2 may overlap with the bending axis BA, or the portion CP1 of the first light blocking layer PHL1 and the portion CP2 of the second light blocking layer PHL2 may overlap with the bending axis BA.

As illustrated in FIGS. 10 to 11C, portions of the first light blocking layer PHL1 and second light blocking layer PHL2 may not extend a total width of the substrate but may be formed to cover specific portions thereof. This varied coverage may enhance the bendability of the display device 10 while maintaining overlap coverage to receive reflected light through the openings PHI1 and PHI2 of the first and second light blocking layers.

Referring to FIGS. 10 to 11C, a portion of the first and second light blocking layers PHL1 and PHL2 may overlap with the bending axis BA in the direction DR3 as illustrated in FIG. 11A. When the display device 10 is bent with respect to the bending axis BA, the substrate SUB and the insulating layer INS may include flat areas FP1 and FP2 and a bent area BP. When the display device 10 is bent as illustrated in FIG. 11B, the first light blocking layer PHL1 may be disposed on the substrate SUB such that a portion of the first light blocking layer PHL1 does not reach the flat area FP2 over the bent area BP. In addition, when the display device 10 is bent, the second light blocking layer PHL2 may be disposed on the substrate SUB such that a portion of the second light blocking layer PHL2 does not reach the flat area FP1 over the bent area BP. Accordingly, the area in which the first and second light blocking layers PHL1 and PHL2 are bent can be decreased, and thus bending stress formed in the first and second light blocking layers PHL1 and PHL2 can be reduced.

FIG. 12 is a plan view illustrating first and second light blocking layers in accordance with still another embodiment of the inventive concepts.

Referring to FIGS. 4 and 12, the display device 10 in accordance with the embodiment of the inventive concepts may include the substrate SUB, the first light blocking layer PHL1 including first sub-light blocking layers SPHL1-1 to SPHL1-6, the second light blocking layer PHL2 including second sub-light blocking layers SPHL2-1 to SPHL2-6, the circuit element layer BPL, and the display element layer LDL. First sub-light blocking layers SPHL1-1 to SPHL1-6 may include openings PIH1 and second sub-light blocking layers SPHL2-1 to SPHL2-6 may include openings PIH2 as described herein.

As illustrated in FIG. 12, the first light blocking layer PHL1 may include (1-1)th to (1-6)th sub-light blocking layers SPHL1-1 to SPHL1-6 spaced apart from each other along the first direction DR1. The second light blocking layer PHL2 may include (2-1)th to (2-6)th sub-light blocking layers SPHL2-1 to SPHL2-6 spaced apart from each other along the first direction DR1. The (1-1)th to (1-6)th sub-light blocking layers SPHL1-1 to SPHL1-6 may be provided on the substrate SUB, and the insulating layer INS may be provided on the substrate SUB on which the (1-1)th to (1-6)th sub-light blocking layers SPHL1-1 to SPHL1-6 are formed. The (2-1)th to (2-6)th sub-light blocking layers SPHL2-1 to SPHL2-6 may be provided on the insulating layer INS. In addition, portions of the first sub-light blocking layer SPHL1 and the second sub-light blocking layer SPHL2, which are adjacent to each other, may overlap with each other.

In an embodiment of the inventive concepts, the (1-1)th to (1-6)th sub-light blocking layers SPHL1-1 to SPHL1-6 and the (2-1)th to (2-6)th sub-light blocking layers SPHL2-1 to SPHL2-6 may extend in a zigzag form along the second direction DR2. The first sub-light blocking layers SPHL1-1 to SPHL1-6 and the second sub-light blocking layers SPHL2-1 to SPHL2-6 extend in the zigzag form along the second direction DR2 as illustrated in FIG. 12, so that bending stress formed when the display device 10 is bent can be minimized.

Figure 13A:
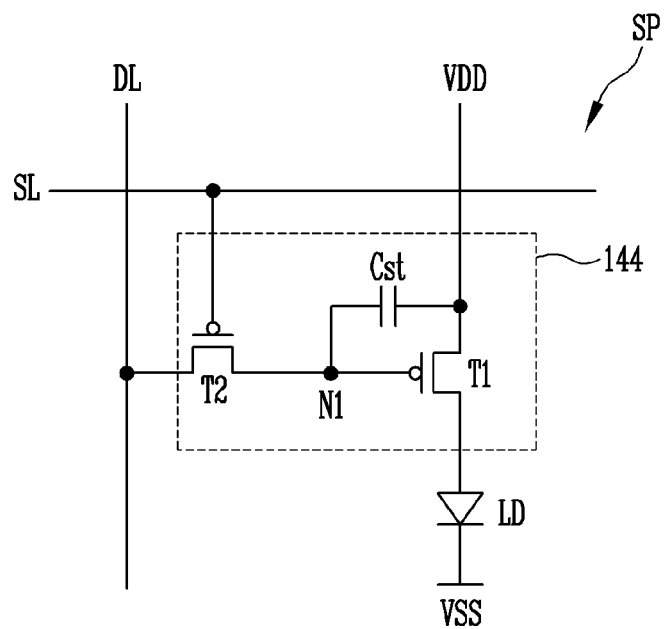
FIGS. 13A and 13B are circuit diagrams illustrating a unit light emitting area of the display device in accordance with an embodiment of the inventive concepts.
Figure 13B:
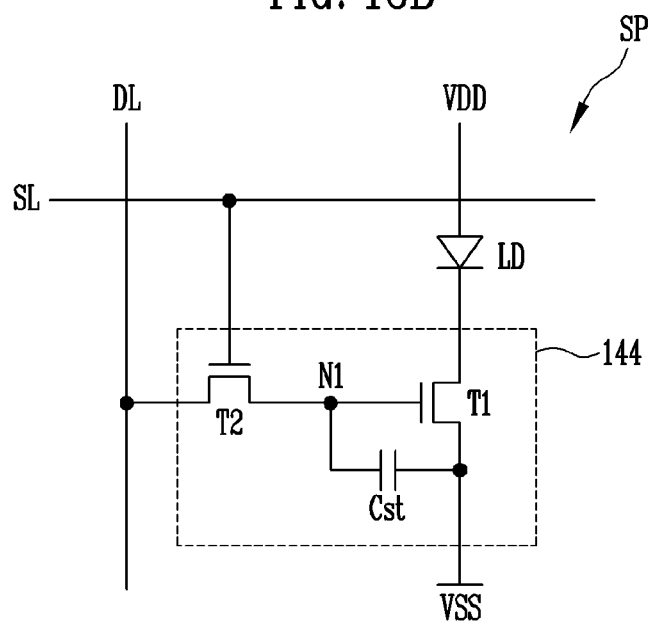

FIGS. 13A and 13B are circuit diagrams illustrating a unit light emitting area of the display device in accordance with an embodiment of the inventive concepts.

FIGS. 13A and 13B illustrate an example of a pixel constituting an active light emitting display panel. In an embodiment of the inventive concepts, the unit light emitting area may be a pixel area in which one sub-pixel is provided.

Referring to FIG. 13A, the sub-pixel SP may include at least one light emitting device LD and a pixel driving circuit 144 connected to the light emitting device LD to drive the light emitting device LD.

A first electrode (e.g., an anode electrode) of the light emitting device LD is connected to a first driving power source VDD via the pixel driving circuit 144, and a second electrode (e.g., a cathode electrode) of the light emitting device LD is connected to a second driving power source VSS.

The first driving power source VDD and the second driving power source VSS may have different potentials. In an example, the second driving power source VSS may have a potential lower by a threshold voltage or more of the light emitting device LD than that of the first driving power source VDD.

The light emitting device LD may emit light with a luminance corresponding to a driving current controlled by the driving circuit 144.

Meanwhile, although an embodiment in which only one light emitting device LD is included in sub-pixel SP is illustrated in FIG. 13A, the inventive concepts are not limited thereto. For example, the sub-pixel SP may include a plurality of light emitting devices LD connected in parallel to each other.

In accordance with an embodiment of the inventive concepts, the pixel driving circuit 144 may include a first transistor T1, a second transistor T2, and a storage capacitor Cst. However, the structure of the pixel driving circuit 144 is not limited to the embodiment illustrated in FIG. 13A.

A first electrode of the first transistor T1 (driving transistor) is connected to the first driving power source VDD, and a second electrode of the first transistor T1 is electrically connected to the first electrode of one or more light emitting devices LD. A gate electrode of the first transistor T1 is connected to a first node N1. The first transistor T1 controls an amount of driving current supplied to the light emitting devices LD, corresponding to a voltage of the first node N1.

A first electrode of the second transistor T2 (switching transistor) is connected to a data line DL, and a second electrode of the second transistor T2 is connected to the first node N1. The first electrode and the second electrode of the second transistor T2 are different electrodes. For example, when the first electrode is a source electrode, the second electrode may be a drain electrode. In addition, a gate electrode of the second transistor T2 is connected to a scan line SL.

The second transistor T2 is turned on when a scan signal having a voltage (e.g., a low voltage) at which the second transistor T2 can be turned on is supplied from the scan line SL, to electrically connect the data line DL and the first node N1. A data signal of a corresponding frame is supplied to the data line DL. Accordingly, the data signal is transferred to the first node N1. The data signal transferred to the first node N1 is charged in the storage capacitor Cst.

One electrode of the storage capacitor Cst is connected to the first driving power source VDD, and the other electrode of the storage capacitor Cst is connected to the first node N1. The storage capacitor Cst charges a voltage corresponding to the data signal supplied to the first node N1, and maintains the charged voltage until a data signal of a next frame is supplied.

For convenience, the pixel driving circuit 144 having a relatively simple structure, which includes the second transistor T2 configured to transfer the data signal to the inside of the sub-pixel SP, the storage capacitor Cst configured to store the data signal, and the first transistor T1 configured to supply a driving current corresponding to the data signal to the light emitting device LD, has been illustrated in FIG. 13A.

However, the inventive concepts are not limited thereto, and the structure of the pixel driving circuit 144 may be variously modified and embodied. In an example, it will be apparent that the pixel driving circuit 144 may further include at least one transistor element such as a transistor element configured to compensate for a threshold voltage of the first transistor T1, a transistor element configured to initialize the first node N1, and/or a transistor element configured to control an emission time of the light emitting device LD, or other circuit elements such as a boosting capacitor configured to boost the voltage of the first node N1.

Although a case where all the transistors, e.g., both the first and second transistor T1 and T2 included in the pixel driving circuit 144 are implemented with a P-type transistor is illustrated in FIG. 13A, the inventive concepts are not limited thereto. That is, at least one of the first and second transistors T1 and T2 included in the pixel driving circuit 144 may be replaced with an N-type transistor.

Referring to FIG. 13B, in accordance with an embodiment of the inventive concepts, the first and second transistors T1 and T2 may be implemented with an N-type transistor. The configuration and operation of a pixel driving circuit 144 illustrated in FIG. 13B are similar to those of the pixel driving circuit 144 of FIG. 13A, except that connection positions of some components are changed due to a change in transistor type. Therefore, a detailed description of this will be omitted.

Figure 14A:
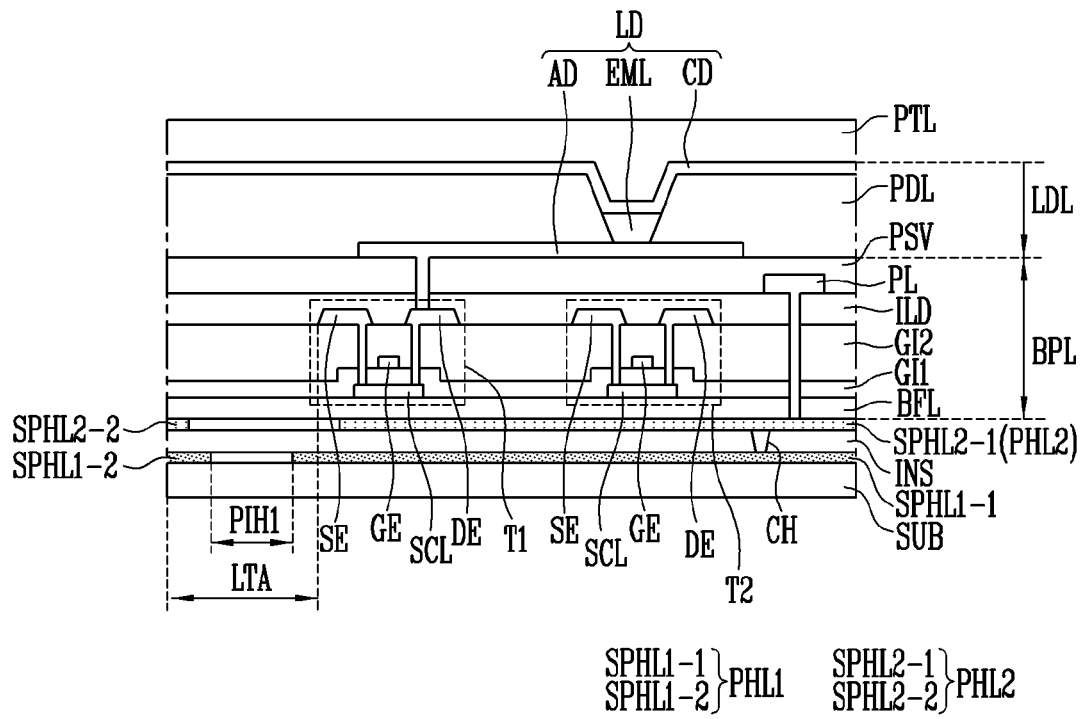
FIGS. 14A and 14B are sectional views of a display device in accordance with various embodiments of the inventive concepts.
Figure 14B:
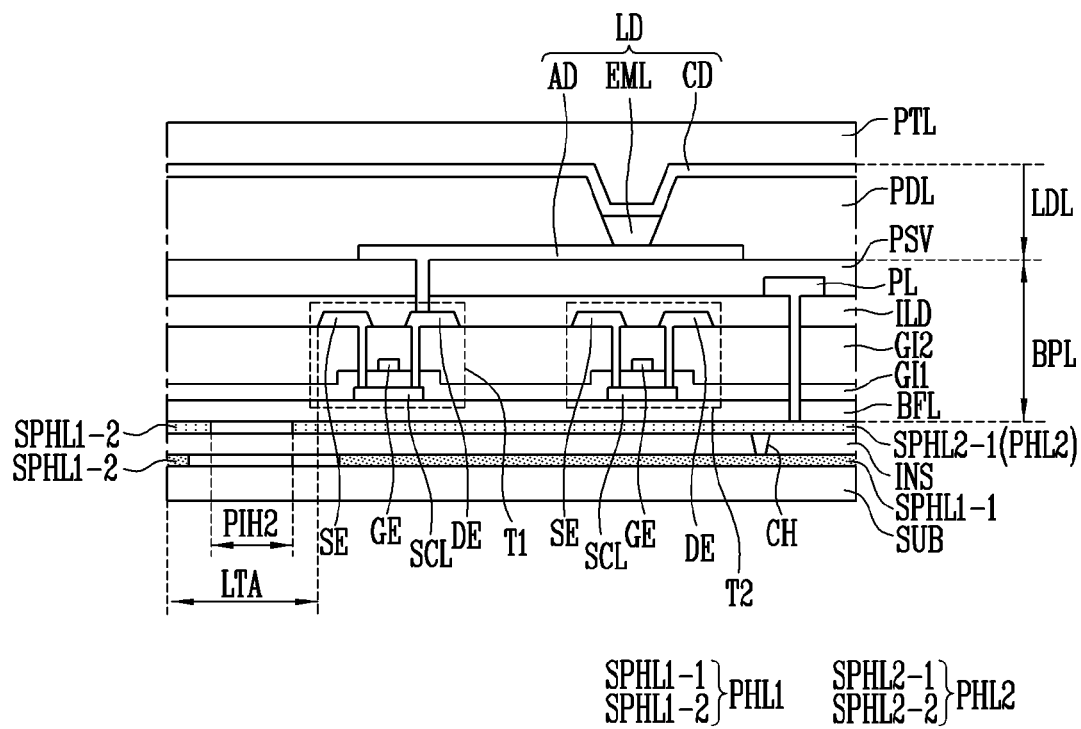

FIGS. 14A and 14B are sectional views of a display device in accordance with various embodiments of the inventive concepts.

Referring to FIGS. 14 and 14B, the display device 10 may include a substrate SUB, a first light blocking layer PHL1, an insulating layer INS, a second light blocking layer PHL2, a circuit element layer BPL, and a display element layer LDL.

The circuit element layer BPL may include a buffer layer BFL, a first transistor T1, a second transistor T2, and a power line PL.

The buffer layer BFL may be provided on the second light blocking layer PHL2. The buffer layer BFL may prevent an impurity from being diffused into the first and second transistors T1 and T2. The buffer layer BFL may be provided in a single layer, but be provided in a multi-layer having at least two layers. When the buffer layer BFL is provided in the multi-layer, the layers may be formed of the same material or be formed of different materials. The buffer layer BFL may be omitted according to the material and process conditions of the substrate SUB.

The first transistor T1 may be a driving transistor electrically connected to a light emitting device LD to drive the light emitting device LD. The second transistor T2 may be a switching transistor electrically connected to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be provided on the buffer layer BFL. The semiconductor layer SCL may include a source region and a drain region, which are respectively in contact with a corresponding source electrode SE and a corresponding drain electrode DE. A region between the source region and the drain region may be a channel region. The semiconductor layer SCL may be a semiconductor pattern made of poly-silicon, amorphous silicon, oxide semiconductor, etc. The channel region is an intrinsic semiconductor pattern undoped with an impurity. The impurity may include impurities such as an n-type impurity, a p-type impurity, and other metals.

The gate electrode GE may be provided on a corresponding semiconductor layer SCL with a first gate insulating layer GI1 interposed therebetween.

The source electrode SE and the drain electrode DE, which are included in the first transistor T1, may be connected to the source region and the drain region of a corresponding semiconductor layer SCL through contact holes penetrating a second gate insulating layer GI2 and the first gate insulating layer GI1, respectively.

The source electrode SE and the drain electrode DE, which are included in the second transistor T2, may be connected to the source region and the drain region of a corresponding semiconductor layer SCL through contact holes penetrating the second gate insulating layer GI2 and the first gate insulating layer GI1, respectively.

The power line PL may be provided on an interlayer insulating layer ILD. A signal corresponding to a driving voltage may be supplied to the power line PL from a driver. For example, a first driving power source VDD applied to pixels PX may be supplied to the power line PL.

The circuit element layer BPL may further include a protective layer PSV covering the first and second transistors T1 and T2. The protective layer PSV may include at least one of an inorganic insulating layer made of an inorganic material and an organic insulating layer made of an organic material. For example, the protective layer PSV may include the inorganic insulating layer and the organic insulating layer on the inorganic insulating layer.

The display element layer LDL may be provided on the circuit element layer BPL, and include the light emitting device LD. Specifically, the light emitting device LD may be provided on the protective layer PSV. The light emitting device LD may include a first electrode AD, a second electrode CD, and an emitting layer EML provided between the first and second electrodes AD and CD.

At least one of the first electrode AD and the second electrode CD may be a transmissive electrode. For example, when the light emitting device LD is a bottom-emission organic light emitting display element, the first electrode AD may be a transmissive electrode, and the second electrode CD may be a reflective electrode. Meanwhile, when the light emitting device LD is a top-emission organic light emitting display element, the first electrode may be a reflective electrode, and the second electrode may be a transmissive electrode. In addition, when the light emitting device LD is a double-emission organic light emitting display element, both the first electrode AD and the second electrode CD may be transmissive electrodes. Hereinafter, a case where the first electrode AD is an anode electrode and the second electrode CE is a cathode electrode is described as an example.

The first electrode AD may be provided on the protective layer PSV. The first electrode AD may be connected to the drain electrode DE included in the first transistor T1 through a contact hole penetrating the protective layer PSV and the interlayer insulating layer ILD.

The first electrode AD may include a reflective layer (not illustrated) capable of reflecting light and a transparent conductive layer (not illustrated) disposed on the top or bottom of the reflective layer.

The reflective layer may include a material capable of reflecting light. For example, the reflective layer may include at least one of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide among Indium Tin Oxide (ITO), Indium Zinc Oxide (IZO), Aluminum Zinc Oxide (AZO), Gallium doped Zinc Oxide (GZO), Zinc Tin Oxide (ZTO), Gallium Tin Oxide (GTO), and Fluorine doped Tin Oxide (FTO).

The emitting layer EML may be disposed on the exposed surface of the first electrode AD. The emitting layer EML may have a multi-layered thin film structure including at least a light generation layer (LGL). For example, the emitting layer EML may include a hole injection layer (HIL) configured to inject holes, a hole transport layer (HTL) having an excellent hole transporting property, the hole transport layer (HTL) configured to increase the opportunity for holes and electrons to be re-combined by suppressing the movement of electrons that fail to be combined in the LGL, the LGL configured to emit light through the re-combination of the injected electrons and holes, a hole blocking layer (HBL) configured to suppress the movement of holes that fail to be combined in the LGL, an electron transport layer (ETL) smoothly transporting electrons to the LGL, and an electron injection layer (EIL) configured to inject electrons.

The color of light generated in the LGL may be one of red, green, blue, and white, but the inventive concepts are not limited thereto. For example, the color of light generated in the LGL may also be one of magenta, cyan, and yellow.

The HIL, the HTL, the HBL, the ETL, and the EIL may be common layers connected in light emitting area adjacent to each other.

The second electrode CD may be a semi-transmissive reflective layer. For example, the second electrode CD may be a thin film metal layer having a thickness thick enough to enable light to be transmitted therethrough. In an example, the second electrode CD may allow a portion of the light emitted from the emitting layer EML to be transmitted therethrough, and reflect the rest of the light emitted from the emitting layer EML.

In an embodiment, the second electrode CD may include a material having a work function lower than that of the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML is not transmitted through the second electrode CD, but the light reflected from the second electrode CD may be re-reflected from the reflective layer. That is, the light emitted from the emitting layer EML may resonate between the reflective layer and the second electrode CD. The light extraction efficiency of the light emitting device LD can be improved by the resonance of the light.

A pixel defining layer (or bank layer) PDL defining a light emitting area of each pixel PX may be provided on the protective layer PSV on which the first electrode AD and the like are disposed. The pixel defining layer PDL may expose an upper surface of the first electrode AD, and protrude from the protective layer PSV along the circumference of each light emitting area.

The emitting layer EML may be provided in the light emitting area of each pixel PX, which is surrounded by the pixel defining layer PDL, and the second electrode CD may be provided on the emitting layer EML.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

A protective layer PTL covering the second electrode CD may be provided over the second electrode CD. The protective layer PTL may be configured as a thin film encapsulation layer. In an embodiment, the thin film encapsulation layer may be replaced with another type of encapsulation layer or encapsulation substrate, at least one protective layer, etc.

The thin film encapsulation layer may prevent oxygen and moisture from penetrating into the light emitting device LD. To this end, the thin film encapsulation layer may include an inorganic layer. The inorganic layer may include at least one of silicon oxide, silicon nitride, silicon oxynitride, aluminum oxide, titanium oxide, zirconium oxide, and tin oxide.

Referring to FIG. 14A, the second light blocking layer PHL2 includes a (2-1)th sub-light blocking layer SPHL2-1 and a (2-2)th sub-light blocking layer SPHL2-2, and a first opening PIH1 of the first light blocking layer PHL1 is located in an area between the (2-1)th and (2-2)th sub-light blocking layers SPHL2-1 and SPHL2-2. In addition, the first opening PIH1 overlaps with a light transmitting area LTA of the circuit element layer BPL.

Referring to FIG. 14B, the first light blocking layer PHL1 incudes a (1-1)th sub-light blocking layer SPHL1-1 and a (1-2)th sub-light blocking layer SPHL1-2, and a second opening PIH2 of the second light blocking layer PHL2 is located in an area between the (1-1)th and (1-2)th sub-light blocking layers SPHL1-1 and SPHL1-2. In addition, the second opening PIH2 overlaps with the light transmitting area LTA of the circuit element layer BPL.

In an embodiment of the inventive concepts, when the second light blocking layer PHL2 includes a light blocking mask made of an opaque metal layer, the second light blocking layer PHL2 may be electrically connected to at least one of signal lines. As illustrated in FIGS. 14A and 14B, the power line PL among the signal lines of the circuit element layer BPL may be electrically connected to the second light blocking layer PHL2 through a contact hole penetrating the interlayer insulating layer ILD, the second gate insulating layer GI2, the first gate insulating layer GI1, and the buffer layer BFL.

In addition, like the second light blocking layer PHL2, when the first light blocking layer PHL1 includes a light blocking mask made of an opaque metal layer, the first light blocking layer PHL1 may be electrically connected to the second light blocking layer PHL2 through a contact hole CH penetrating the insulating layer INS. Referring to FIG. 14A, the (2-1)th sub-light blocking layer SPHL2-1 may be electrically connected to the first light blocking layer PHL1 through the contact hole CH. Although not illustrated in FIG. 14A, the first light blocking layer PHL1 may be electrically connected to the (2-2)th sub-light blocking layer SPHL2-2 through a contact hole penetrating the insulating layer INS.

Referring to FIG. 14B, the second light blocking layer PHL2 may be electrically connected to the (1-1)th sub-light blocking layer SPHL1-1 of PHL1 through the contact hole CH. Although not illustrated in FIG. 14B, the second light blocking layer PHL2 may be electrically connected to the (1-2)th sub-light blocking layer SPHL1-2 through a contact hole penetrating the insulating layer INS.

Other components connected to the power line PL serve as a parallel resistor with respect to a power source (e.g., a voltage of the first driving power source VDD) supplied through the power line PL. As described above, the contact holes electrically connected to the power line PL and the first and second light blocking layers PHL1 and PHL2 may serve as a parallel resistor with respect to the power line PL. An increase in parallel resistors results in a decrease in total resistance with respect to the power line PL, and therefore, the supply of power through the power line PL can be more efficiently made. Consequently, an IR-drop occurring in the display panel 110 can be minimized. Further, the efficiency of light emitted from the light emitting device LD can be improved.

Meanwhile, although a case where the second light blocking layer PHL2 is electrically connected to the power line PL is illustrated in FIGS. 14A and 14B, the power line BPL is not limited to the signal line of the circuit element layer BPL, to which the second light blocking layer PHL2 is connected. For example, the second light blocking layer PHL2 may be connected to the data line DL, the scan line SL or the like, which is one of the signal lines of the circuit element layer BPL.

Figure 15A:
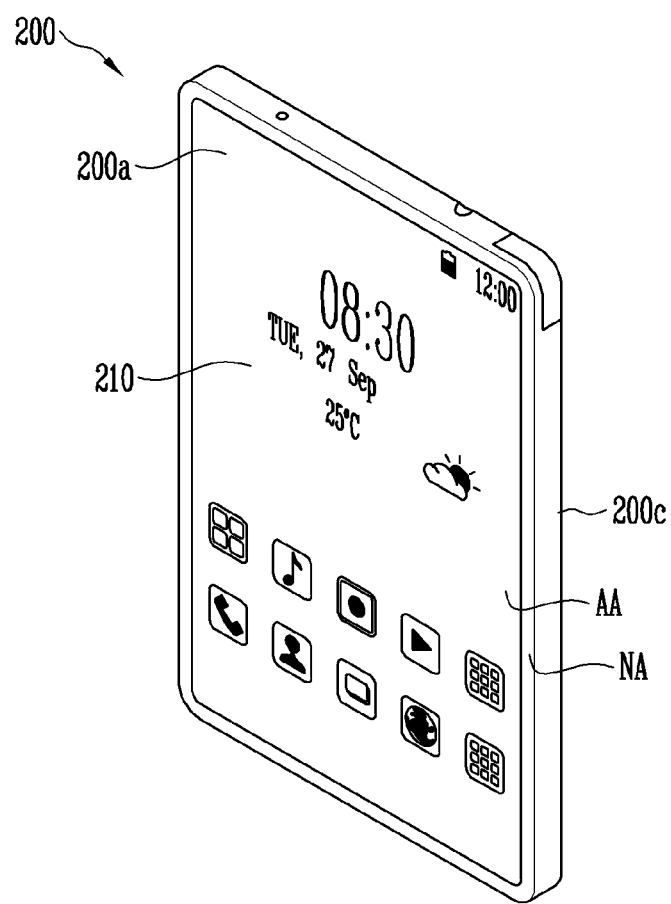
FIG. 15A is a perspective view illustrating a front surface of a portable terminal in accordance with an embodiment of the inventive concepts.
Figure 15B:
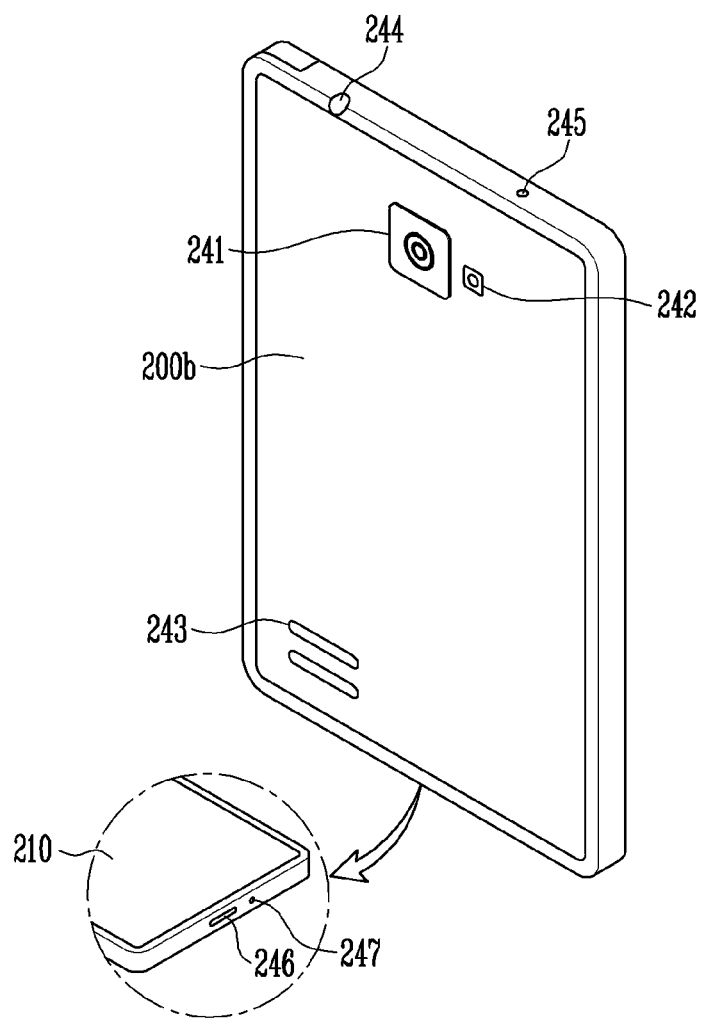
FIG. 15B is a perspective view illustrating a rear surface of the portable terminal.

FIG. 15A is a perspective view illustrating a front surface of a portable terminal in accordance with an embodiment of the inventive concepts, and FIG. 15B is a perspective view illustrating a rear surface of the portable terminal.

In FIGS. 15A and 15B, the portable terminal 200 may be the same display device as the display device 10 illustrated in FIG. 1. In an example, the portable terminal 200 may include the display element layer LDL, the circuit element layer BPL, the first light blocking layer PHL1, and the second light blocking layer PHL2, which are described with reference to FIGS. 2A to 14B.

For convenience of description, an example in which a main home screen is displayed on a display 210 of the portable terminal 200 is illustrated in FIG. 15A.

Referring to FIGS. 1, 15A, and 15B, the display 210 may be disposed at a front surface 200a of the portable terminal 200 in accordance with the embodiment of the inventive concepts. The front surface 200a of the portable terminal 200 may include a display area AA in which the display 210 is disposed to display various data and a non-display area NA provided at at least one side of the display area AA.

A rear camera 241, a flash 242, a speaker 243, and the like may be located at a rear surface 200b of the portable terminal 200 in accordance with the embodiment of the inventive concepts. In addition, for example, a power/reset button, a volume button, a terrestrial DMB antenna configured to broadcast reception, one or more microphones 245 and 247, and the like may be located at a side surface 200c of the portable terminal 200 in accordance with the embodiment of the inventive concepts. In addition, a connector 246 may be formed at a lower end side surface of the portable terminal 200 in accordance with the embodiment of the inventive concepts. The connector 246 is formed with a plurality of electrodes, and may be connected to an external device by wire. An earphone connection jack 244 may be disposed at an upper end side surface of the portable terminal 200.

The display 210 may be disposed as a large screen so as to occupy the entire of the front surface 200a of the portable terminal 200. When the display 210 is entirely disposed at the front surface 200a of the portable terminal, the portable terminal 200 may be substantially referred to as a "full front display." In the "full front display," the front surface 200a of the portable terminal 200 may be entirely the display area AA.

The above-described display 210 may be an organic light emitting display panel. The portable terminal 200 including the above-described display 210 may be an organic light emitting display device. In some embodiments, the display 210 may be configured as a touch screen including touch electrodes.

As illustrated in FIG. 15A, a main home screen may be displayed on the display 210. The main home screen may be a first screen displayed on the display 210, when the power of the portable terminal 200 is turned on. States of the portable terminal 200, such as a battery charging state, the intensity of a received signal, and a current time, may be displayed at an upper end of the display 210. The display 210 may display various contents (e.g., texts, images, videos, icons, and/or symbols) to a user.

In accordance with the inventive concepts, the display device and the portable terminal may include a light blocking layer capable of minimizing bending stress, so that bending can be easily performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the inventive concepts as set forth in the following claims.

What is claimed is:

1. A display device comprising:
    a substrate;
    a display element layer provided on the substrate, the display element layer including a plurality of light emitting devices;
    a circuit element layer provided between the substrate and the display element layer, the circuit element layer including a plurality of signal lines through which a signal configured to drive the light emitting devices is transferred and a plurality of light transmitting areas which are located between the signal lines in a plan view and allow light to be transmitted therethrough;
    a first light blocking layer provided between the substrate and the circuit element layer, the first light blocking layer including a plurality of first openings; and
    a second light blocking layer provided on the first light blocking layer, the second light blocking layer including a plurality of second openings,
    wherein:
    the second light blocking layer comprises second sub-light blocking layers disposed to be spaced apart from each other along a first direction, the second sub-light blocking layers each having the second openings;
    the first openings of the first light blocking layer overlap with an area between the second sub-light blocking layers;
    the first light blocking layer comprises first sub-light blocking layers disposed to be spaced apart from each other along the first direction, the first sub-light blocking layers each having the first openings;
the first openings of each of the first sub-light blocking layers are provided not to overlap with the second sub-light blocking layers;
the second openings of each of the second sub-light blocking layers are provided not to overlap with the first sub-light blocking layers;
the display device is configured to have a bending state or a non-bending state; and
when the display device is changed from a bending state to a non-bending state, the first openings of each of the first sub-light blocking layers and the second sub-light blocking layers remain non-overlapping, and the second openings of each of the second sub-light blocking layers and the first sub-light blocking layers remain non-overlapping.

2. The display device of claim 1, wherein the first openings and the second openings that overlap with the light transmitting areas are different from each other.

3. The display device of claim 1, wherein the substrate is a flexible substrate configured to be bent with respect to a bending axis.

4. The display device of claim 3, wherein the second sub-light blocking layers are adjacent to the bending axis and are spaced apart from each other with the bending axis interposed therebetween.

5. The display device of claim 3, wherein the first openings of the first light blocking layer are disposed to overlap with the bending axis.

6. The display device of claim 1, wherein at least a portion of one of the first sub-light blocking layers and at least a portion of one of the second sub-light blocking layers overlap with each other.

7. The display device of claim 1, wherein the second light blocking layer is electrically connected to at least one of the signal lines of the circuit element layer.

8. The display device of claim 7, wherein the first light blocking layer is electrically connected to the second light blocking layer.

9. The display device of claim 1, further comprising:
a sensor layer provided on an opposite surface of one surface of the substrate, on which the first light blocking layer is provided, and wherein the sensor layer is configured to sense incident light.

10. The display device of claim 9, wherein each of the first and second openings provides an optical path of light incident into the sensor layer.

11. A display device comprising:
a substrate;
a display element layer provided on the substrate, the display element layer including a plurality of light emitting devices;
a circuit element layer provided between the substrate and the display element layer, the circuit element layer including a plurality of signal lines through which a signal configured to drive the light emitting devices is transferred and a plurality of light transmitting areas which are located between the signal lines in a plan view and allow light to be transmitted therethrough;
a first light blocking layer provided between the substrate and the circuit element layer, the first light blocking layer including a plurality of first openings; and
a second light blocking layer provided on the first light blocking layer, the second light blocking layer including a plurality of second openings,
wherein:
the first light blocking layer comprises first sub-light blocking layers disposed to be spaced apart from each other along a first direction, the first sub-light blocking layers each having the first openings;
the second openings of the second light blocking layer overlap with an area between the first sub-light blocking layers;
the second light blocking layer comprises second sub-light blocking layers disposed to be spaced apart from each other along the first direction, the second sub-light blocking layers each having the second openings;
the first openings of each of the first sub-light blocking layers are provided not to overlap with the second sub-light blocking layers;
the second openings of each of the second sub-light blocking layers are provided not to overlap with the first sub-light blocking layers;
the display device is configured to have a bending state or a non-bending state; and
when the display device is changed from a bending state to a non-bending state, the first openings of each of the first sub-light blocking layers and the second sub-light blocking layers remain non-overlapping, and the second openings of each of the second sub-light blocking layers and the first sub-light blocking layers remain non-overlapping.

12. The display device of claim 11, wherein the substrate is a flexible substrate configured to be bent with respect to a bending axis, and
wherein the first sub-light blocking layers adjacent to the bending axis are spaced apart from each other with the bending axis interposed there between.

13. The display device of claim 12, wherein a portion of at least one of the first light blocking layer and the second light blocking layer overlaps with the bending axis.

14. The display device of claim 11, wherein at least a portion of one of the first sub-light blocking layers and at least a portion of one of the second sub-light blocking layers overlap with each other.

* * * * *